United States Patent
Song et al.

(10) Patent No.: US 12,324,344 B2
(45) Date of Patent: Jun. 3, 2025

(54) LIGHT-EMITTING DEVICE INCLUDING NANOSTRUCTURES AND DISPLAY APPARATUS INCLUDING THE SAME

(71) Applicants: SAMSUNG ELECTRONICS CO., LTD., Suwon-si (KR); IUCF-HYU (INDUSTRY-UNIVERSITY COOPERATION FOUNDATION HANYANG UNIVERSITY), Seoul (KR)

(72) Inventors: Sunjin Song, Seoul (KR); Seokho Song, Seoul (KR); Wonjae Joo, Seongnam-si (KR)

(73) Assignees: SAMSUNG ELECTRONICS CO., LTD., Suwon-si (KR); IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 0 days.

(21) Appl. No.: 18/586,704

(22) Filed: Feb. 26, 2024

(65) Prior Publication Data
US 2024/0244875 A1   Jul. 18, 2024

Related U.S. Application Data

(62) Division of application No. 17/165,522, filed on Feb. 2, 2021, now Pat. No. 11,943,952.

(30) Foreign Application Priority Data

Aug. 3, 2020   (KR) .................. 10-2020-0096945

(51) Int. Cl.
*H10K 50/818* (2023.01)
*H10K 50/852* (2023.01)
(Continued)

(52) U.S. Cl.
CPC ......... *H10K 59/878* (2023.02); *H10K 50/818* (2023.02); *H10K 50/852* (2023.02); *H10K 59/121* (2023.02); *H10K 59/876* (2023.02)

(58) Field of Classification Search
CPC ... H10K 50/818; H10K 50/852; H10K 59/121
See application file for complete search history.

(56) References Cited

U.S. PATENT DOCUMENTS 8,957,578 B2   2/2015   Lee
9,692,012 B2   6/2017   Lee et al.
(Continued)

FOREIGN PATENT DOCUMENTS

EP   3 309 852 A1       4/2018
EP      3503224 A1 *    6/2019   ............. H01L 27/32
(Continued)

OTHER PUBLICATIONS

European Search Report dated Sep. 10, 2021 in corresponding European Application No. 21160904.5.
(Continued)

*Primary Examiner* — Suberr L Chi
(74) *Attorney, Agent, or Firm* — Sughrue Mion, PLLC

(57) ABSTRACT

Provided is a light-emitting device including a reflective layer including a plurality of nano-structures two-dimensionally disposed regularly and a low-refractive-index layer disposed adjacent to the plurality of nano-structures, a first electrode disposed on the reflective layer, an organic emission layer disposed on the first electrode, and a second electrode disposed on the organic emission layer, wherein each of the plurality of nano-structures includes a non-metallic material, and the low-refractive-index layer includes a dielectric material having a second refractive index lower than a first refractive index of the non-metallic material.

16 Claims, 24 Drawing Sheets

(51) Int. Cl.
    *H10K 59/121*     (2023.01)
    *H10K 59/80*     (2023.01)

(56) References Cited

U.S. PATENT DOCUMENTS

| | | |
|---|---|---|
| 9,761,843 B2 | 9/2017 | Haag et al. |
| 10,615,372 B2 | 4/2020 | Joo et al. |
| 2010/0141612 A1 | 6/2010 | Desieres et al. |
| 2013/0181242 A1 | 7/2013 | Cho |
| 2018/0102093 A1 | 4/2018 | Kim et al. |
| 2019/0198817 A1 | 6/2019 | Joo et al. |

FOREIGN PATENT DOCUMENTS

| | | | |
|---|---|---|---|
| EP | 3 686 946 A1 | 7/2020 | |
| EP | 3503224 B1 * | 1/2021 | ............. H01L 27/32 |
| JP | 2007-258113 A | 10/2007 | |
| KR | 10-2013-0084848 A | 7/2013 | |
| KR | 10-2015-0054075 A | 5/2015 | |
| KR | 10-2018-0040038 A | 4/2018 | |
| KR | 10-1944769 B1 | 2/2019 | |
| KR | 10-2019-0076832 A | 7/2019 | |
| WO | 2009064021 A1 | 5/2009 | |

OTHER PUBLICATIONS

Machine Translation of JR 2007-258113, published 2007.
Communication issued Sep. 19, 2024 by the Korean Intellectual Property Office in Korean Patent Application No. 10-2020-0096945.

* cited by examiner

LIGHT-EMITTING DEVICE INCLUDING NANOSTRUCTURES AND DISPLAY APPARATUS INCLUDING THE SAME

CROSS-REFERENCE TO RELATED APPLICATION

The present application is a divisional of U.S. application Ser. No. 17/165,522 filed Feb. 2, 2021, which claims priority to Korean Patent Application No. 10-2020-0096945, filed on Aug. 3, 2020, in the Korean Intellectual Property Office, the disclosure of which is incorporated herein in their entirety by reference.

BACKGROUND

1. Field

Example embodiments of the present disclosure relate to a light-emitting device and a display apparatus including the same, and more particularly to, an organic light-emitting device and an organic light-emitting display apparatus having high color purity without using a color filter.

2. Description of Related Art

A display device including an organic light-emitting diode (OLED) is a display device that forms an image when holes injected from an anode and electrons injected from a cathode combine with each other in an organic emission layer to emit light. OLEDs have excellent display characteristics such as wide viewing angles, fast response times, small thickness, low manufacturing costs, and high contrast.

Also, OLEDs may emit light of a desired color by selecting an appropriate material as a material of the organic emission layer. According to this principle, a color display apparatus may be implemented by using an OLED. For example, an organic emission layer of a blue pixel may be formed of an organic material that generates blue light, an organic emission layer of a green pixel may be formed of an organic material that generates green light, and an organic emission layer of a red pixel may be formed of an organic material that generates red light. Also, a white OLED may be implemented by arranging a plurality of organic materials that respectively generate blue light, green light, and red light in one organic emission layer or by arranging pairs of two or more types of organic materials that are complementary to each other.

SUMMARY

One or more example embodiments provide a light-emitting device and a display apparatus including the same, and more particularly, an organic light-emitting device and an organic light-emitting display apparatus having high color purity without using a color filter.

Additional aspects will be set forth in part in the description which follows and, in part, will be apparent from the description, or may be learned by practice of the example embodiments.

According to an aspect of an example embodiment, there is provided a light-emitting device including a reflective layer including a plurality of nano-structures two-dimensionally disposed regularly and a low-refractive-index layer disposed adjacent to the plurality of nano-structures, a first electrode disposed on the reflective layer, an organic emission layer disposed on the first electrode, and a second electrode disposed on the organic emission layer, wherein each of the plurality of nano-structures includes a non-metallic material, and the low-refractive-index layer includes a dielectric material having a second refractive index lower than a first refractive index of the non-metallic material.

The first electrode may be a transparent electrode, and the second electrode may be a semi-transmissive electrode that is configured to reflect part of light and transmits remaining part of the light.

The non-metallic material may include a dielectric material or a semiconductor material.

The dielectric material may include at least one of $TiO_2$, $BaTiO_3$, $Cr_2O_3$, $HfO_2$, and SiNx.

The semiconductor material may include at least one of Si, ZnS, ZnSe, GaP, InP, GaAs, GaN, and $AlAs_2$.

The reflective layer and the second electrode may form a micro-cavity having a resonance wavelength.

A diameter of each of the plurality of nano-structures, a height of each of the plurality of nano-structures, and a period of the plurality of nano-structures of the reflective layer may be determined such that the reflective layer has a highest reflectance for light having a wavelength corresponding to the resonance wavelength of the micro-cavity.

The period of the plurality of nano-structures may be smaller than the resonance wavelength of the micro-cavity.

The period of the plurality of nano-structures may range from 200 nm to 500 nm.

The height of each of the plurality of nano-structure may range from 20 nm to 200 nm.

A top surface of the low-refractive-index layer may be disposed on top surfaces of the plurality of nano-structures, the top surfaces of the plurality of nano-structures may be spaced apart from the first electrode, and the top surface of the low-refractive-index layer may directly contact the first electrode.

Top surfaces of the plurality of nano-structures and a top surface of the low-refractive-index layer may be disposed on a same plane, and the top surfaces of the plurality of nano-structures and the top surface of the low-refractive-index layer may directly contact the first electrode.

The reflective layer may further include a metal reflective film that is flat and directly contacts bottom surfaces of the plurality of nano-structures.

The low-refractive-index layer may be disposed on a top surface the metal reflective film that is not in contact with the bottom surfaces of the plurality of nano-structures and may be disposed on a bottom surface of the metal reflective film.

The reflective layer may further include a metal reflective film that is flat and is disposed on a bottom surface of the low-refractive-index layer.

The low-refractive-index layer may include a first low-refractive-index layer disposed on bottom surfaces of the plurality of nano-structures and a second low-refractive-index layer disposed on side surfaces and top surfaces of the plurality of nano-structures, and the first low-refractive-index layer and the second low-refractive-index layer may include dielectric materials having different refractive indexes.

According to another aspect of an example embodiment, there is provided a display apparatus including a first pixel configured to emit light of a first wavelength, and a second pixel configured to emit light of a second wavelength different from the first wavelength, wherein the first pixel includes a reflective layer including a plurality of nano-structures two-dimensionally disposed regularly and a low-refractive-index layer disposed adjacent to the plurality of nano-structures, a first electrode disposed on the reflective layer, an organic emission layer disposed on the first electrode and configured to emit visible light including light of the first wavelength and light of the second wavelength, and a second electrode disposed on the organic emission layer, wherein each of the plurality of nano-structures includes a non-metallic material, and the low-refractive-index layer includes a dielectric material having a second refractive index lower than a first refractive index of the non-metallic material.

The first electrode may be a transparent electrode, and the second electrode may be a semi-transmissive electrode that is configured to reflect part of light and transmits remaining part of the light.

The non-metallic material may include a dielectric material or a semiconductor material.

The dielectric material may include at least one of $TiO_2$, $BaTiO_3$, $Cr_2O_3$, $HfO_2$, and SiNx.

The semiconductor material may include at least one of Si, ZnS, ZnSe, GaP, InP, GaAs, GaN, and $AlAs_2$.

A diameter of each of the plurality of nano-structures, a height of each of the plurality of nano-structures, and a period of the plurality of nano-structures of the reflective layer may be determined such that the reflective layer of the first pixel has a highest reflectance for light of the first wavelength and is configured to transmit or absorb light of the second wavelength.

The period of the plurality of nano-structures may be smaller than the first wavelength.

Top surfaces of the plurality of nano-structures and a top surface of the low-refractive-index layer may be disposed on a same plane, and the top surfaces of the plurality of nano-structures and the top surface of the low-refractive-index layer may directly contact the first electrode.

A top surface of the low-refractive-index layer may be disposed on top surfaces of the plurality of nano-structures, the top surfaces of the plurality of nano-structures may be spaced apart from the first electrode, and the top surface of the low-refractive-index layer may directly contact the first electrode.

The reflective layer may further include a metal reflective film that is flat and directly contacts bottom surfaces of the plurality of nano-structures.

The low-refractive-index layer may be disposed on a top surface of the metal reflective film that is not in contact with the bottom surfaces of the plurality of nano-structures and may be disposed on a bottom surface of the metal reflective film.

The reflective layer further may include a metal reflective film that is flat and disposed on a bottom surface of the low-refractive-index layer.

The second pixel may include a reflective layer including a plurality of nano-structures two-dimensionally disposed regularly and a low-refractive-index layer is disposed adjacent to the plurality of nano-structures, a first electrode disposed on the reflective layer, an organic emission layer disposed on the first electrode and configured to emit visible light including light of the first wavelength and light of the second wavelength, and a second electrode disposed on the organic emission layer, wherein each of the plurality of nano-structures of the reflective layer of the second pixel may include a non-metallic material, and the low-refractive-index layer of the reflective layer of the second pixel may include a dielectric material having a first refractive index lower than a second refractive index of the non-metallic material.

A diameter of each of the plurality of nano-structures, a height of each of the plurality of nano-structures, and a period of the plurality of nano-structures of the second pixel may be determined such that the reflective layer of the second pixel has a highest reflectance for light of the second wavelength and is configured to transmit or absorb light of the first wavelength.

A height of each of the plurality of nano-structures of the reflective layer of the first pixel and a height of each of the plurality of nano-structures of the reflective layer of the second pixel may be same, and a period of the plurality of nano-structures of the reflective layer of the first pixel and a period of the plurality of nano-structures of the reflective layer of the second pixel may be different from each other.

The first electrode, the organic emission layer, and the second electrode of the first pixel may be respectively same as the first electrode, the organic emission layer, and the second electrode of the second pixel.

According to another aspect of an example embodiment, there is provided a light-emitting device including a reflective layer including a plurality of nano-structures two-dimensionally disposed regularly and a low-refractive-index layer disposed adjacent to the plurality of nano-structures, a first electrode disposed on the reflective layer, an organic emission layer disposed on the first electrode, and a second electrode disposed on the organic emission layer, wherein each of the plurality of nano-structures includes a dielectric material or a semiconductor material and the low-refractive-index layer includes a dielectric material having a second refractive index lower than a first refractive index of the non-metallic material, wherein the reflective layer and the second electrode form a micro-cavity having a resonance wavelength, and wherein a diameter of each of the plurality of nano-structures, a height of each of the plurality of nano-structures, and a period of the plurality of nano-structures of the reflective layer are determined such that the reflective layer has a highest reflectance for light having a wavelength corresponding to the resonance wavelength of the micro-cavity.

BRIEF DESCRIPTION OF THE DRAWINGS

The above and/or other aspects, features, and advantages of example embodiments of the disclosure will be more apparent from the following description taken in conjunction with the accompanying drawings, in which.

DETAILED DESCRIPTION

Figure 1:
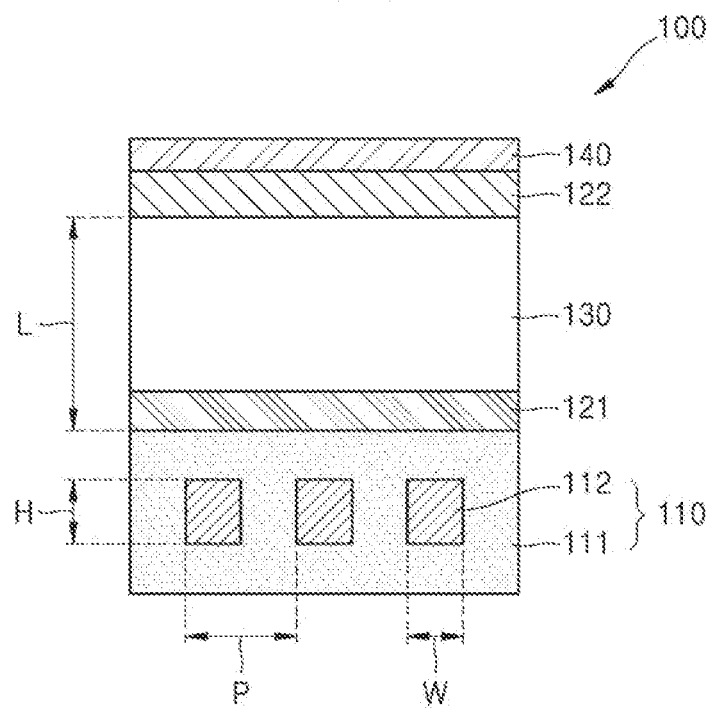
FIG. 1 is a cross-sectional view illustrating a structure of a light-emitting device according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, a light-emitting device and a display apparatus including the same will be described in detail with reference to the accompanying drawings. Like reference numerals denote like elements throughout, and in the drawings, sizes of elements may be exaggerated for clarity and convenience of explanation. Also, the example embodiments described below are merely examples, and various modifications may be made from the example embodiments.

When an element is referred to as being "on" another element, it may be directly on the other element, or intervening elements may be present therebetween. The singular forms "a," "an," and "the" are intended to include the plural forms as well, unless the context clearly indicates otherwise. When a portion "includes" an element, another element may be further included, rather than excluding the existence of the other element, unless otherwise described.

The use of the terms "a" and "an," and "the" and similar referents in the context of describing the present disclosure is to be construed to cover both the singular and the plural. The steps of all methods described herein may be performed in any suitable order unless otherwise indicated herein or otherwise clearly contradicted by context, and are not limited to the described order.

The terms such as "unit" or "module" refer to units that perform at least one function or operation, and the units may be implemented as hardware or software or as a combination of hardware and software.

Also, lines or members connecting elements illustrated in the drawings are merely illustrative of functional connections and/or physical or circuit connections. In an actual device, the connections between components may be represented by various functional connections, physical connections, or circuit connections that are replaceable or added.

The use of any and all examples, or language provided herein, is intended merely to better describe the disclosure and does not pose a limitation on the scope of the disclosure unless otherwise claimed.

FIG. 1 is a cross-sectional view illustrating a structure of a light-emitting device according to an example embodiment. Referring to FIG. 1, a light-emitting device 100 according to an example embodiment may include a reflective layer 110 including a plurality of nano-structures 112 that are two-dimensionally arranged, a first electrode 121 disposed on the reflective layer 110, an organic emission layer 130 disposed on the first electrode 121, and a second electrode 122 disposed on the organic emission layer 130. The light-emitting device 100 may further include a passivation layer 140 that is transparent and is disposed on the second electrode 122 opposite to the organic emission layer 130 and protects the second electrode 122.

Figure 2:
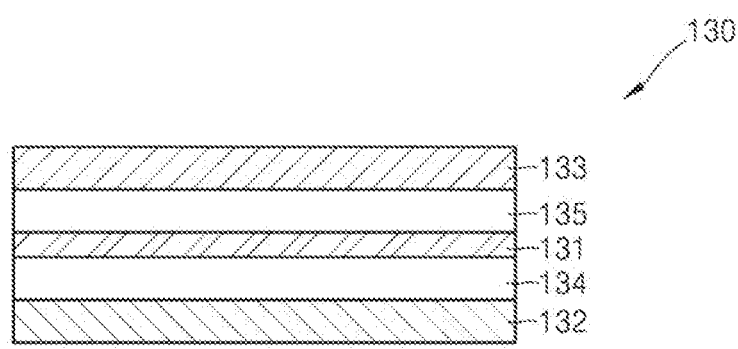
FIG. 2 is a detailed cross-sectional view illustrating a structure of an organic emission layer of FIG. 1 according to an example embodiment.

The light-emitting device 100 may be an organic light-emitting diode (OLED). For example, FIG. 2 is a detailed cross-sectional view illustrating a structure of the organic emission layer 130 of FIG. 1 according to an example embodiment. Referring to FIG. 2, the organic emission layer 130 may include a hole injection layer 132 disposed on a top surface of the first electrode 121, an organic emission material layer 131 disposed on a top surface of the hole injection layer 132, and an electron injection layer 133 disposed on a top surface of the organic emission material layer 131. In this structure, holes injected by the hole injection layer 132 and electrons injected by the electron injection layer 133 may combine with each other in the organic emission material layer 131 to generate light. A wavelength of the generated light may be determined by an energy band gap of a light-emitting material of the organic emission material layer 131.

The organic emission layer 130 may further include a hole transfer layer 134 disposed between the hole injection layer 132 and the organic emission material layer 131 to more smoothly transfer holes. The organic emission layer 130 may further include an electron transfer layer 135 disposed between the electron injection layer 133 and the organic emission material layer 131 to more smoothly transfer electrons. The organic emission layer 130 may include various additional layers when necessary. For example, the organic emission layer 130 may further include an electron block layer between the hole transfer layer 134 and the organic emission material layer 131, and may further include a hole block layer between the organic emission material layer 131 and the electron transfer layer 135.

The organic emission material layer 131 may be configured to emit visible light. For example, the organic emission material layer 131 may be configured to emit light in any one of a wavelength band corresponding to red light, a wavelength band corresponding to green light, and a wavelength band corresponding to blue light. However, embodiments are not limited thereto. For example, the organic emission material layer 131 may be configured to emit white visible light including all of red light, green light, and blue light.

Figure 3:
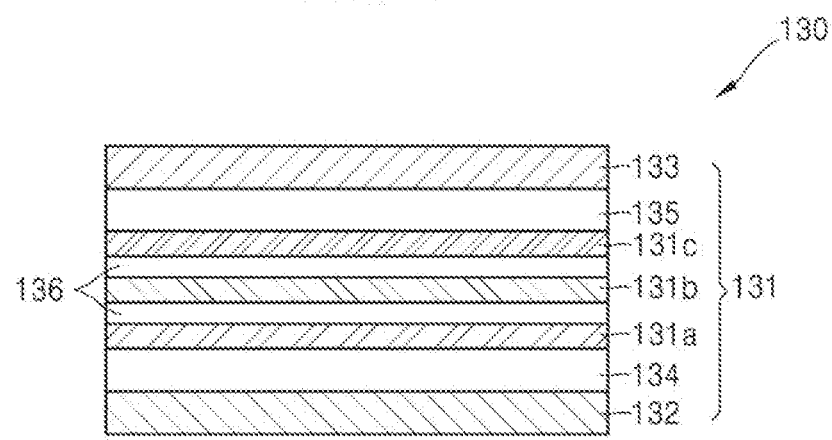
FIG. 3 is a detailed cross-sectional view illustrating a structure of the organic emission layer of FIG. 1 according to another example embodiment.

For example, FIG. 3 is a detailed cross-sectional view illustrating a structure of the organic emission layer 130 of FIG. 1 according to another example embodiment. Referring to FIG. 3, the organic emission material layer 131 may include a first organic emission material layer 131a that emits red light, a second organic emission material layer 131b that emits green light, and a third organic emission material layer 131c that emits blue light. Also, an exciton blocking layer 136 may be disposed between the first organic emission material layer 131a and the second organic emission material layer 131b and between the second organic emission material layer 131b and the third organic emission material layer 131c. In this case, the organic emission layer 130 may emit white light. However, a structure of the organic emission layer 130 that emits white light is not limited thereto. Instead of including three organic emission material layers, that is, the first through third organic emission material layers 131a, 131b, and 131c, the organic emission layer 130 may include two organic emission material layers that are complementary to each other.

The first electrode 121 disposed on a bottom surface of the organic emission layer 130 may function as an anode that provides holes. The second electrode 122 disposed on the top surface of the organic emission layer 130 may function as a cathode that provides electrons. To this end, the first electrode 121 may be formed of a material having a relatively high work function, and the second electrode 122 may be formed of a material having a relatively low work function.

Also, the first electrode 121 may be a transparent electrode through which light (e.g., visible light) is transmitted. For example, the first electrode 121 may include a transparent conductive oxide such as indium tin oxide (ITO), indium zinc oxide (IZO), or aluminum zinc oxide (AZO).

The second electrode 122 may be a semi-transmissive electrode that reflects part of light and transmits the remaining part of the light. To this end, the second electrode 122 may include a very thin reflective metal. For example, the second electrode 122 may be formed of silver (Ag), aluminum (Al), gold (Au), nickel (Ni), or an alloy thereof, or may have a two-layer structure including silver (Ag) and magnesium (Mg) or a two-layer structure including aluminum (Al) and lithium (Li). A total thickness of the second electrode 122 may range from about 10 nm to about 50 nm. Because the second electrode 122 is very thin, part of light may pass through the reflective metal.

The reflective layer 110 may be configured to reflect light generated by the organic emission layer 130 and transmitted through the first electrode 121. For example, the reflective layer 110 may be configured to selectively reflect only light of a specific wavelength band and transmit or absorb light of another wavelength band.

The reflective layer 110 and the second electrode 122 may constitute a micro-cavity. For example, the micro-cavity may be formed between the reflective layer 110 and the second electrode 122 of the light-emitting device 100. For example, light generated by the organic emission layer 130 may reciprocate and resonate between the reflective layer 110 and the second electrode 122, and then light corresponding to a resonance wavelength of the micro-cavity may be emitted to the outside through the second electrode 122.

The resonance wavelength of the micro-cavity formed between the reflective layer 110 and the second electrode 122 may be determined by an optical length L of the micro-cavity. For example, when the resonance wavelength of the micro-cavity is $\lambda$, the optical length L of the micro-cavity may be $n\lambda/2$, where n is a natural number. The optical length L of the micro-cavity may be determined by a sum of an optical thickness of layers constituting the micro-cavity between the reflective layer 110 and the second electrode 122, a phase retardation by the second electrode 122, and a phase shift (e.g., a phase retardation) by the reflective layer 110. Here, the optical thickness of the layers constituting the micro-cavity between the reflective layer 110 and the second electrode 122 is not a simple physical thickness, but is a thickness considering refractive indexes of materials of the layers constituting the micro-cavity. For example, the optical thickness of the layers constituting the micro-cavity may be a sum of an optical thickness of the first electrode 121 and an optical thickness of the organic emission layer 130.

According to the example embodiment, the optical length L or the resonance wavelength of the micro-cavity may be adjusted by adjusting only the phase shift by the reflective layer 110 while fixing the optical thickness of the layers constituting the micro-cavity and the phase retardation by the second electrode 122. In order to adjust a wavelength selectivity of the reflective layer 110 and the phase shift by the reflective layer 110, a phase modulation surface may be formed on a reflective surface of the reflective layer 110 contacting the first electrode 121. The phase modulation surface may include very small nano-scale patterns. For example, the phase modulation surface of the reflective layer 110 may have a meta-structure in which nano-structures having a size smaller than a wavelength of visible light are periodically arranged.

Referring to FIG. 1, the reflective layer 110 may include the plurality of nano-structures 112 two-dimensionally arranged in a regular periodic structure and a low-refractive-index layer 111 surrounding the plurality of nano-structures 112. The low-refractive-index layer 111 may completely surround a bottom surface, a side surface, and a top surface of each of the nano-structures 112. The plurality of nano-structures 112 may be completely buried and encapsulated in the low-refractive-index layer 111. Accordingly, the top surfaces of the plurality of nano-structures 112 may not contact the first electrode 121, and only the top surface of the low-refractive-index layer 111 may directly contact the first electrode 121. The plurality of nano-structures 112 included in the low-refractive-index layer 111 may be horizontally arranged on the same plane.

Each of the nano-structures 112 may include a non-metallic material having a first refractive index, and the low-refractive-index layer 111 may include a dielectric material having a second refractive index lower than the first refractive index. For example, the non-metallic material of each of the nano-structures 112 may include a dielectric material or a semiconductor material having a high refractive index and a low light absorption in a visible light region. For example, the dielectric material may include at least one of titanium dioxide ($TiO_2$), barium titanate ($BaTiO_3$), chromium oxide ($Cr_2O_3$), hafnium dioxide ($HfO_2$), and silicon nitride (SiNx), and the semiconductor material may include at least one of silicon (Si), zinc sulfide (ZnS), zinc selenide (ZnSe), gallium phosphide (GaP), indium phosphide (InP), gallium arsenide (GaAs), gallium nitride (GaN), and aminolevulinate synthase ($AlAs_2$). Also, the low-refractive-index layer 111 may be formed of e a dielectric material having a low refractive index and a low absorption in a visible light band such as silicon dioxide ($SiO_2$) or siloxane-based spin on glass (SOG). Although each of the nano-structures 112 and the low-refractive-index layer 111 includes a material having a low reflectance, a guide mode resonance is formed by periodically arranging the plurality of nano-structures 112 having a size smaller than a wavelength of visible light, and thus the reflective layer 110 may have a high reflectance for light of a specific wavelength.

For example, when each nano-structure 112 has a cylindrical shape, a wavelength of light reflected by the reflective layer 110 may be determined by a diameter W of each nano-structure 112, a thickness T of each nano-structure 112, and a pitch or period P of the plurality of nano-structures 112. When each nano-structure 112 has a polygonal column shape, a wavelength of light reflected by the reflective layer 110 may be determined by a maximum width W of each nano-structure 112, the thickness T of each nano-structure 112, and the pitch or period P of the plurality of nano-structures 112.

In particular, when the thickness T of the nano-structure 112 is relatively small, a full width at half-maximum of a reflectance peak may be small, and thus a reflectance at a wavelength other than the specific wavelength may be relatively low, and when the thickness T of the nano-structure 112 increases, the full width at half-maximum of the reflectance peak increases. For example, the thickness T of the nano-structure 112 may range from about 20 nm to about 200 nm. Also, when the thickness T of the nano-structure 112 is fixed, a reflectance at the specific wavelength may be controlled by adjusting the diameter or width W of each nano-structure 112 or the pitch or period P of the plurality of nano-structures 112. For example, when the light-emitting device 100 is used in a visible light region, the diameter or width W of each nano-structure 112 may range from about 100 nm to about 250 nm, and the pitch or period P of the plurality of nano-structures 112 may range from about 200 nm to about 500 nm.

The phase retardation of reflected light by the reflective layer 110 may be determined by the diameter or width W of each nano-structure 112, the pitch or period P of the plurality of nano-structures 112, and the thickness T of each nano-structure 112.

Accordingly, the resonance wavelength of the micro-cavity may be determined by the diameter W of each nano-structure 112, the thickness T of each nano-structure 112, and the period P of the plurality of nano-structures 112. For example, when the resonance wavelength of the micro-cavity is $\lambda$, the diameter W of each nano-structure 112, the thickness T of each nano-structure 112, and the period P of the plurality of nano-structures 112 may be selected so that the optical length L of the micro-cavity satisfies $n\lambda/2$, where n is a natural number. The diameter W of each nano-structure 112, the thickness T of each nano-structure 112, and the period P of the plurality of nano-structures 112 may be selected such that the reflective layer 110 has a highest reflectance for light having a wavelength corresponding to the resonance wavelength of the micro-cavity.

Accordingly, the resonance wavelength of the micro-cavity may be more easily matched to an emission wavelength or an emission color of the light-emitting device 100. For example, when the light-emitting device 100 is a red light-emitting device, the diameter W of each nano-structure 112, the thickness T of each nano-structure 112, and the period P of the plurality of nano-structures 112 may be selected such that the resonance wavelength of the micro-cavity corresponds to a red wavelength band and the reflective layer 110 has a highest reflectance for light of the red wavelength band. In this way, the emission wavelength of the light-emitting device 100 may be determined only by using a structure of the phase modulation surface of the reflective layer 110.

Figure 4:
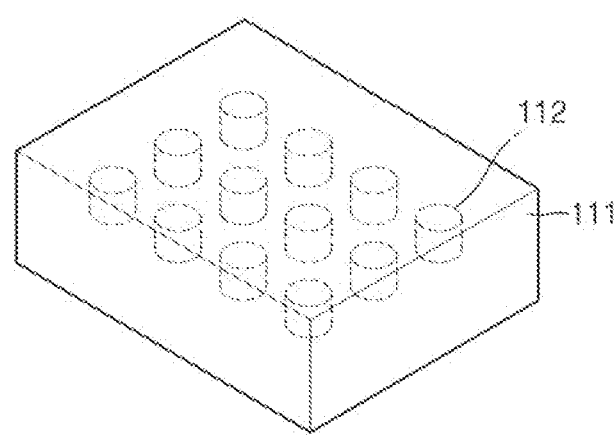
FIG. 4 is a perspective view illustrating a structure of a reflective layer of FIG. 1.

In order to prevent the micro-cavity from having polarization dependence, the plurality of nano-structures 112 may be regularly and periodically arranged to have 4-fold symmetry. When the micro-cavity has the polarization dependence, only light of a specific polarization component may resonate, thereby reducing the luminous efficiency of the light-emitting device 100. For example, FIG. 4 is a perspective view illustrating a structure of the reflective layer 110 of FIG. 1. Referring to FIG. 4, the plurality of nano-structures 112 each having a cylindrical shape may be two-dimensionally arranged in a regular square array. Although the nano-structure 112 has a cylindrical shape in FIG. 4, a shape of the nano-structure 112 is not limited thereto. For example, the nano-structure 112 may have an elliptical column shape, a polygonal column shape such as a rectangular column shape, a pentagonal column shape, or the like, or a cross-like column shape.

Figure 5:
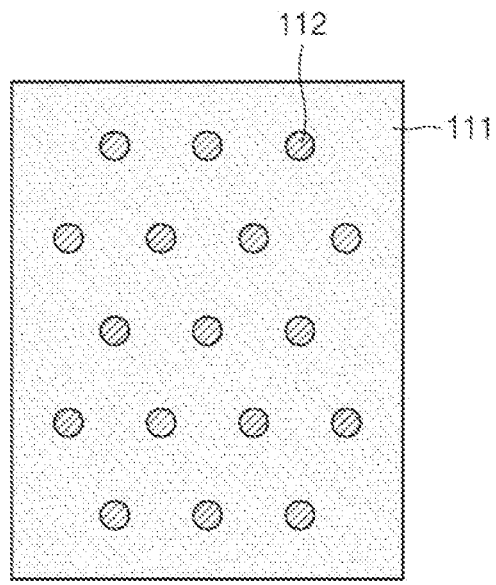
FIGS. 5 and 6 are plan views illustrating an arrangement of a plurality of nano-structures of the reflective layer of FIG. 1 according to another example embodiment.
Figure 6:
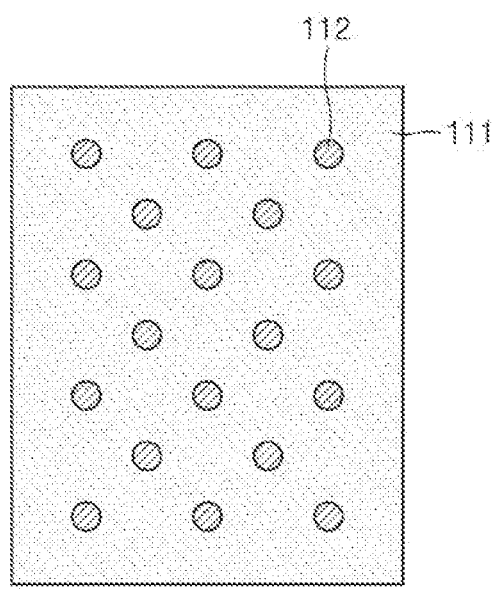
Figure 7A:
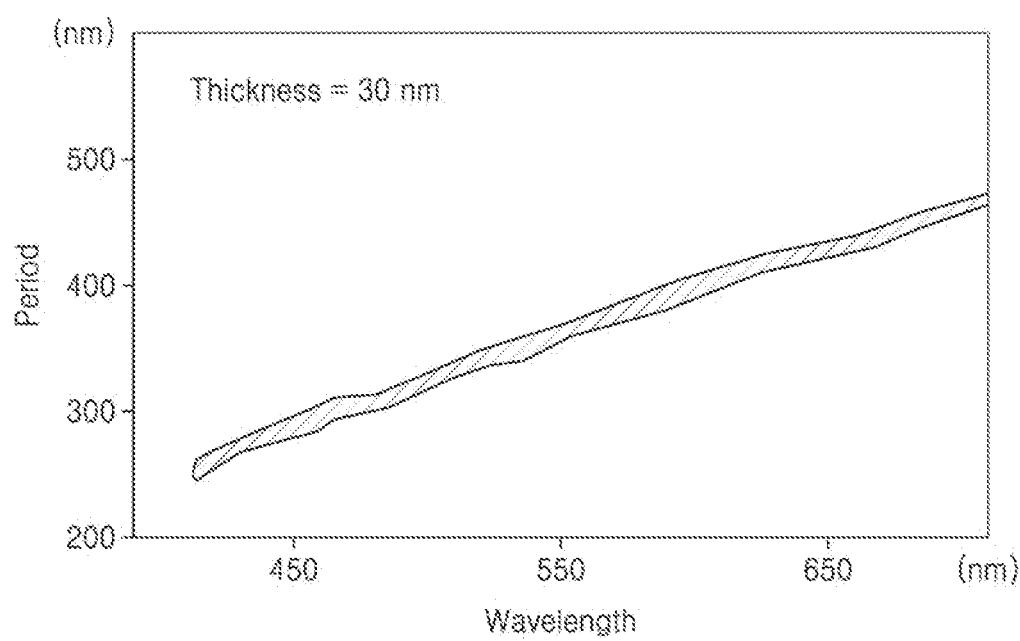
FIGS. 7A, 7B, 7C, and 7D are graphs illustrating a change in a reflectance of a reflective layer according to a thickness and a period of each nano-structure.
Figure 7B:
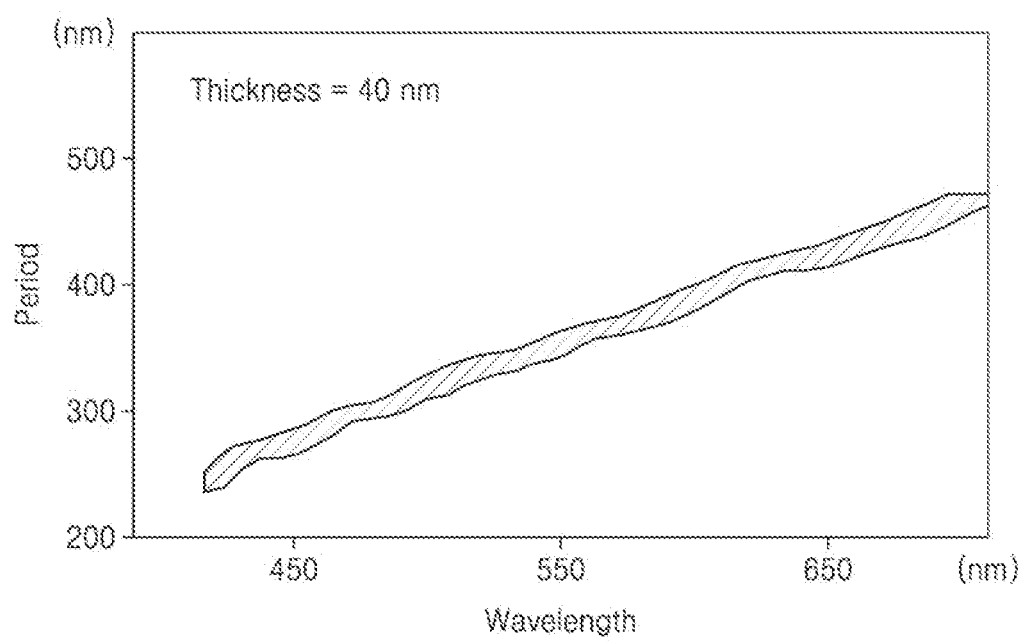
Figure 7C:
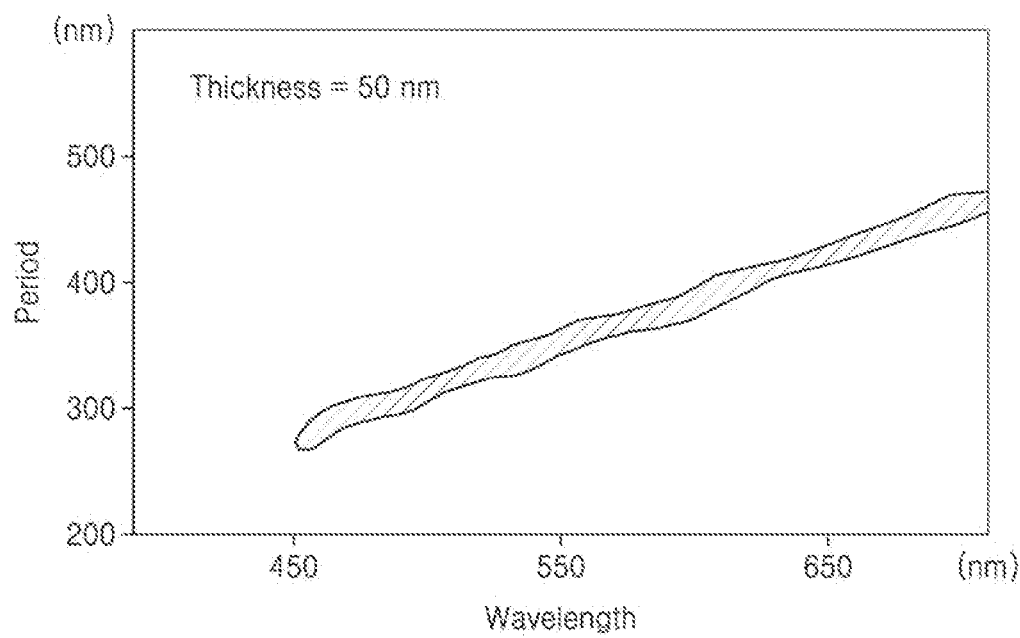
Figure 7D:
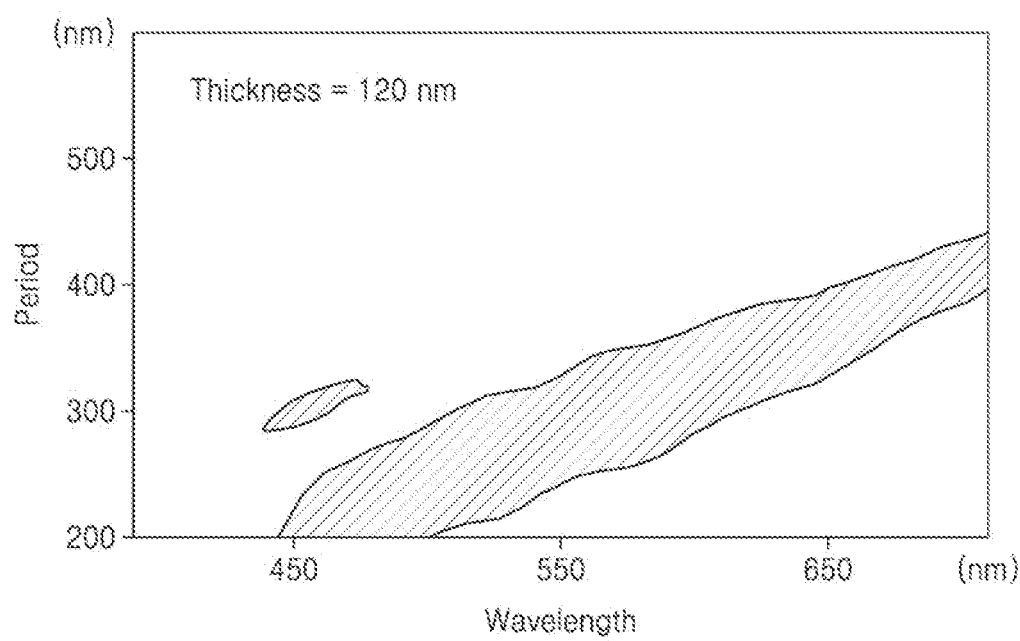

FIGS. 5 and 6 are plan views illustrating an arrangement of the plurality of nano-structures 112 of the reflective layer 110 of FIG. 1 according to example embodiments. The plurality of nano-structures 112 may have any arrangement other than a square array arrangement as long as the plurality of nano-structures have 4-fold symmetry. For example, as shown in FIG. 5, the plurality of nano-structures 112 may be two-dimensionally arranged in a hexagonal array or, as shown in FIG. 6, the plurality of nano-structures 112 may be two-dimensionally arranged in a body-centered square array.

Referring to FIGS. 4 and 5, the plurality of nano-structures 112 are arranged in a regular two-dimensional array pattern. However, embodiments are not limited thereto, and when the plurality of nano-structures 112 has 4-fold symmetry, the plurality of nano-structures 112 may be arranged in any other array. For example, the plurality of nano-structures 112 may be irregularly arranged. In another example embodiment, the arrangement of the plurality of nano-structures 112 may be designed to be different from 4-fold symmetry such that the light-emitting device 100 emits only light of a specific polarization component. For example, the plurality of nano-structures 112 may be arranged in a one-dimensional array pattern.

A reflection characteristics of the reflective layer 110 including the plurality of nano-structures 112 formed of a non-metallic material will now be described.

FIGS. 7A through 7D are graphs illustrating a change in a reflectance of the reflective layer 110 according to a thickness and a period of each nano-structure 112 according to example embodiments. Each nano-structure 112 has a cylindrical shape and is formed of Si, and the low-refractive-index layer 111 is formed of $SiO_2$. FIGS. 7A through 7D are graphs when a thickness T of each nano-structure 112 is 30 nm, 40 nm, 50 nm, and 120 nm. A hatched area in the graphs of FIGS. 7A through 7D indicates a case where a reflectance of the reflective layer 110 is equal to or greater than 80%.

As illustrated in the graphs of FIGS. 7A through 7D, when a thickness of each nano-structure 112 is fixed, a wavelength band in which a reflectance of the reflective layer 110 is equal to or greater than 80% may increase as a period of the plurality of nano-structures 112 increases. The period of the plurality of nano-structures 112 is smaller than a wavelength in which a reflectance of the reflective layer 110 is equal to or greater than 80%. Accordingly, the period of the plurality of nano-structures 112 may be selected to be smaller than a resonance wavelength of a micro-cavity.

As a thickness of each nano-structure 112 increases, a width of a wavelength band in which a reflectance of the reflective layer 110 is equal to or greater than 80% for the same period increases which indicates that a full width at half-maximum of a reflectance peak increases. For example, a width of a wavelength band in which a reflectance is equal to or greater than 80% when a thickness of each nano-structure 112 is 120 nm is greater than a width of a wavelength band in which a reflectance is equal to or greater than 80% when a thickness of each nano-structure 112 is 30 nm. When the full width at half-maximum of the reflectance peak increases, the color purity of light emitted by the light emitting device 100 may decrease. Accordingly, reflectance characteristics of the reflective layer 110 may vary according to a material of the nano-structure 112 and a material of the low-refractive-index layer 111, but a thickness of each nano-structure 112 may be selected to be equal to or less than 200 nm.

Figure 8A:
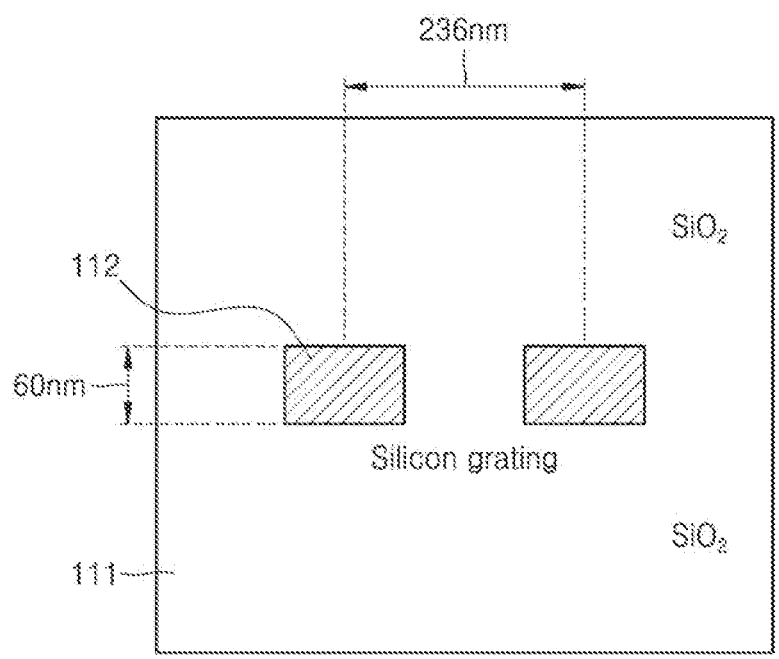
FIGS. 8A, 8B, and 8C are cross-sectional views illustrating a reflective layer having a selectively high reflectance respectively for blue light, green light, and red light according to an example embodiment.
Figure 8B:
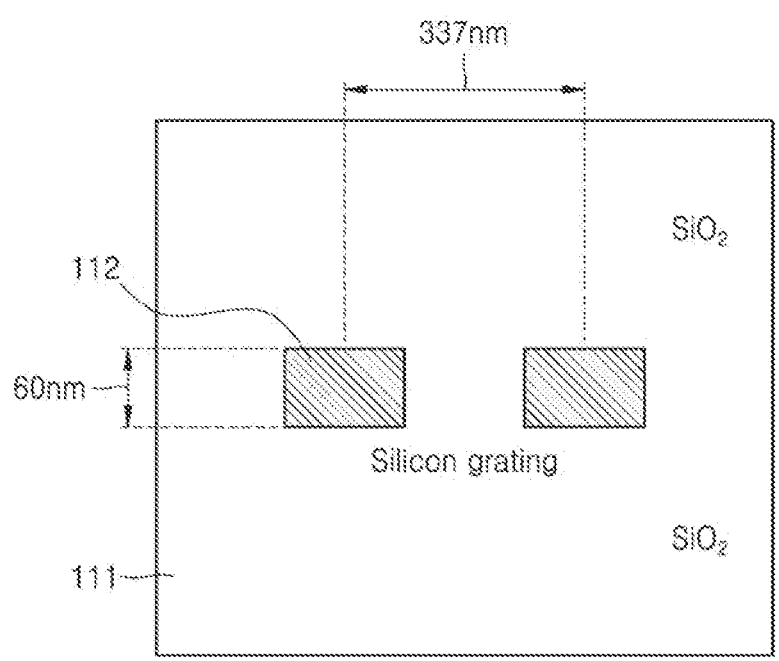
Figure 8C:
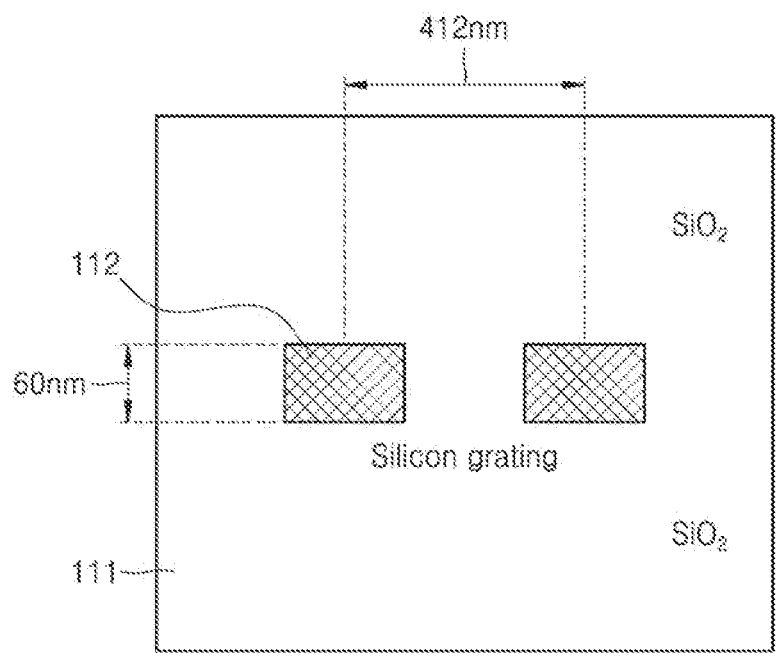

FIGS. 8A through 8C are cross-sectional views illustrating the reflective layer 110 having a selectively high reflectance respectively for blue light, green light, and red light according to an example embodiment. The nano-structure 112 has a cylindrical shape and is formed of Si, and the low-refractive-index layer 111 is formed for $SiO_2$. In FIGS. 8A through 8C, a thickness of the nano-structure 112 is fixed to 60 nm. A period of the plurality of nano-structures 112 of the reflective layer 110 of FIG. 8A which reflects blue light may be 236 nm, a period of the plurality of nano-structures 112 of the reflective layer 110 of FIG. 8B which reflects green light may be 337 nm, and a period of the plurality of nano-structures 112 of the reflective layer 110 of FIG. 8C which reflects red light may be 412 nm. In FIGS. 8A through 8C, a diameter of each nano-structure 112 is selected to be ½ of the period.

Figure 9:
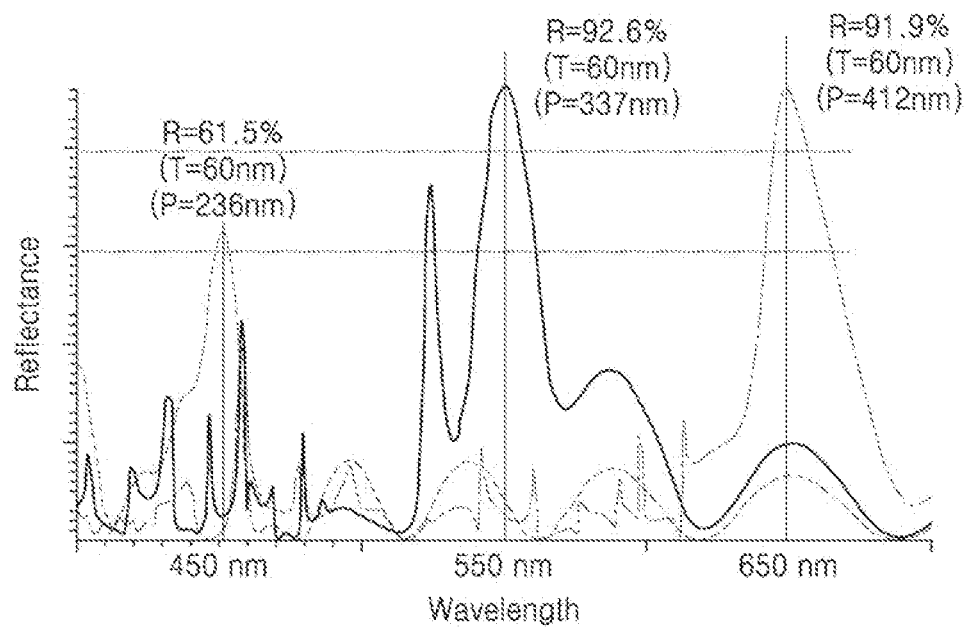
FIG. 9 is a graph illustrating a relationship between a reflectance of a reflective layer and a wavelength for a period of a plurality of nano-structures.

FIG. 9 is a graph illustrating a relationship between a reflectance of the reflective layer 110 and a wavelength for a period of the plurality of nano-structures 112. Referring to the graph of FIG. 9, the reflective layer 110 of FIG. 8A has a highest reflectance of 61.5% for blue light having a wavelength of about 450 nm, the reflective layer 110 of FIG. 8B has a highest reflectance of 92.6% for green light having a wavelength of about 550 nm, and the reflective layer 110 of FIG. 8C has a highest reflectance of 91.9% for red light having a wavelength of about 650 nm. Accordingly, when the reflective layer 110 including the plurality of nano-structures 112 formed of a non-metallic material is used, an emission wavelength of the light-emitting device 100 may be selected by increasing a reflectance only for a specific wavelength in a visible light region.

Figure 10:
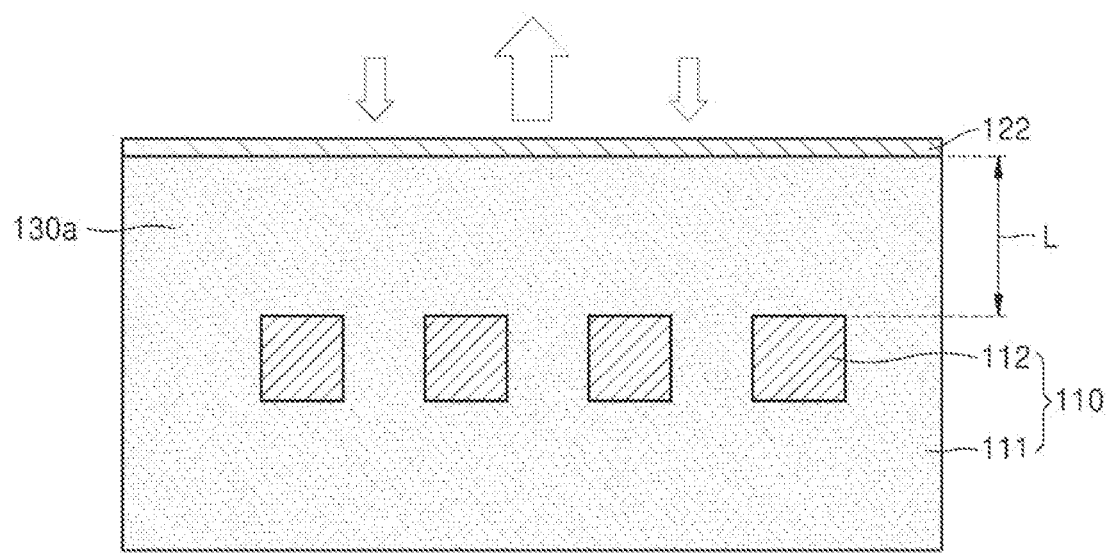
FIG. 10 is a cross-sectional view illustrating a structure for simulating characteristics of a light-emitting device according to an optical length of a micro-cavity.

A top-emission type micro-cavity having high efficiency may be formed by filling the organic emission layer 130 between the reflective layer 110 including the plurality of nano-structures 112 formed of the non-metallic material and the second electrode 122 that is thin and flat. FIG. 10 is a cross-sectional view illustrating a structure for simulating characteristics of the light-emitting device 100 according to an optical length of a micro-cavity. In the structure of FIG. 10, $SiO_2$ that is the same as a material of the low-refractive-index layer 111, instead of an organic emission layer, is filled between the reflective layer 110 and the second electrode 122. The reflective layers of FIGS. 8A through 8C are each used as the reflective layer 110. Silver (Ag) having a thickness of 30 nm was used for the second electrode 122.

By emitting white light to the second electrode 122 from the outside a spectrum of reflected light is measured, and the optical length L of the micro-cavity is changed. In this case, because light having a wavelength corresponding to the resonance wavelength of the micro-cavity is absorbed by $SiO_2$ while resonating between the reflective layer 110 and the second electrode 122, a reflectance with respect to the light having the wavelength corresponding to the resonance wavelength of the micro-cavity is reduced.

Figure 11:
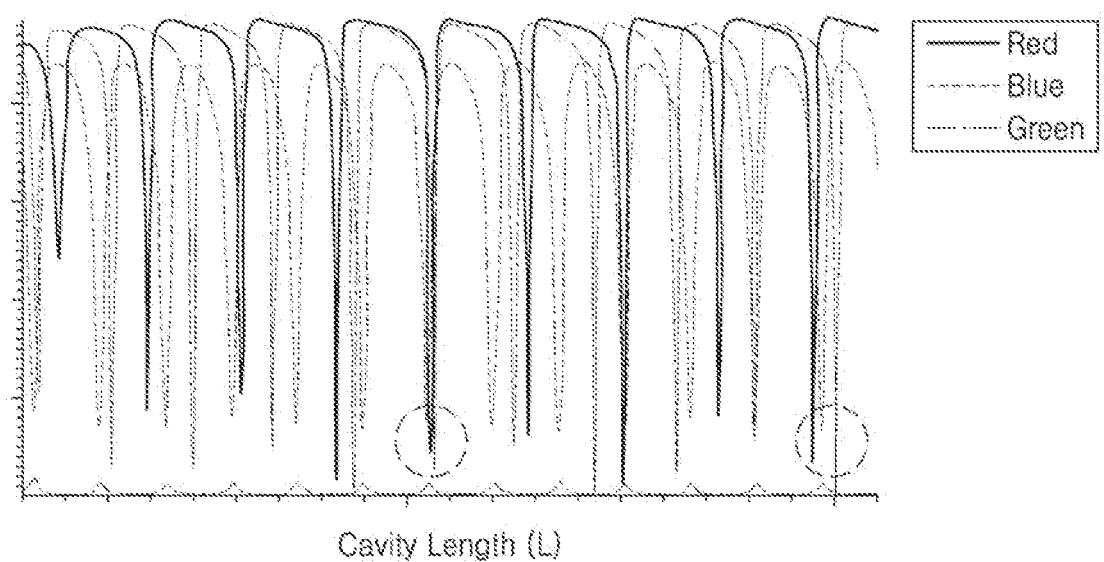
FIG. 11 is a graph illustrating a result of a simulation of reflectances of blue light, green light, and red light according to the optical length of the micro-cavity of FIG. 10.

FIG. 11 is a graph illustrating reflectances of blue light, green light, and red light according to the optical length L of the micro-cavity of FIG. 10. As the optical length L of the micro-cavity changes, a wavelength of light absorbed by the structure of FIG. 10 changes. As marked by a dashed circle, there exists the optical length L of the micro-cavity for absorbing all of blue light, green light, and red light. For example, all of blue light, green light, and red light may be absorbed at an optical length corresponding to a common multiple of an optical length for absorbing the blue light, an optical length for absorbing the green light, and an optical length for absorbing the red light.

Considering this point, when the optical length L of the micro-cavity of the light-emitting device 100 is appropriately selected, an emission color of the light-emitting device 100 may be determined only with dimensions of the nano-structure 112 of the reflective layer 110. Accordingly, physical thicknesses of a light-emitting device for emitting blue light, a light-emitting device for emitting green light, and a light-emitting device for emitting red light may be set to be the same. For example, the light-emitting device for emitting the blue light, the light-emitting device for emitting the green light, and the light-emitting device for emitting the red light may be manufactured by fixing the optical length L of the micro-cavity and changing dimensions of the nano-structure 112. Physical thicknesses of the manufactured light-emitting devices for respectively emitting the blue light, the green light, and the red light may be set to be the same.

Figure 12:
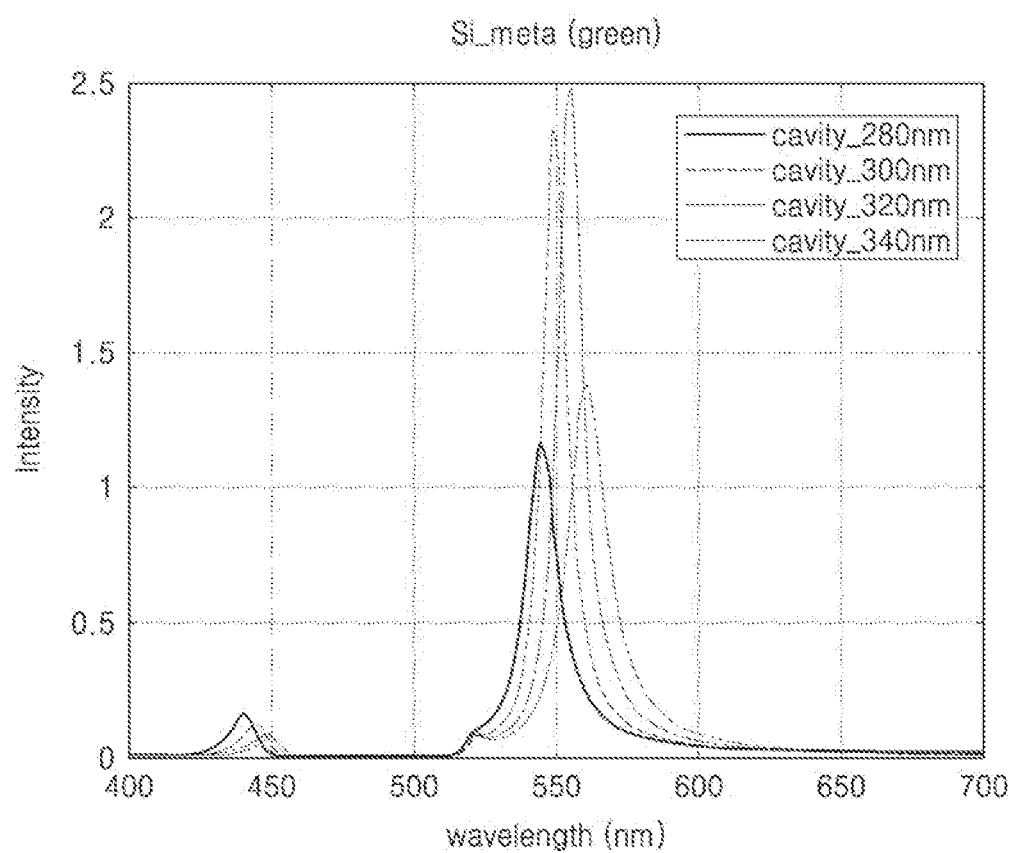
FIGS. 12 and 13 are cross-sectional views illustrating emission spectra of green light and red light according to the optical length of the micro-cavity of FIG. 10.
Figure 13:
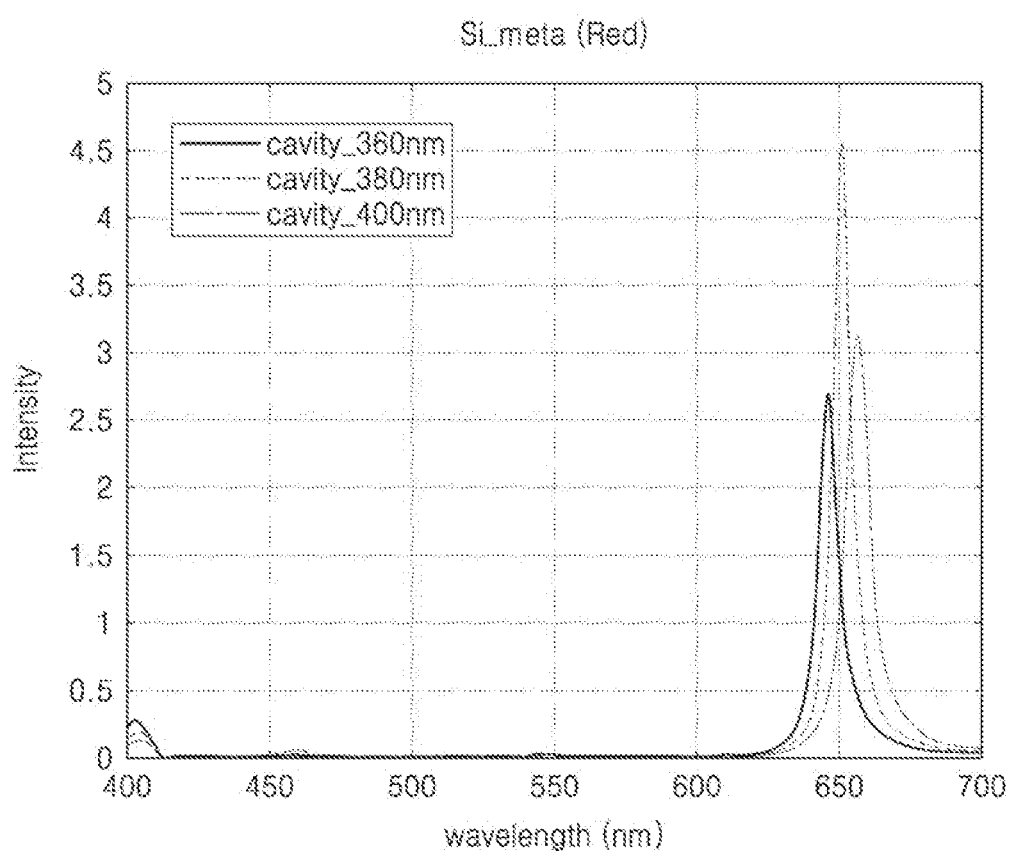

FIGS. 12 and 13 are graphs illustrating emission spectra of green light and red light according to the optical length L of the micro-cavity of FIG. 10. In FIGS. 12 and 13, a white light source is disposed in $SiO_2$ between the reflective layer 110 and the second electrode 122, and an intensity of light emitted by the second electrode 122 was calculated.

FIG. 12 illustrates a result when the reflective layer of FIG. 8B is used as the reflective layer 110. Referring to the graph of FIG. 12, when the optical length L of the micro-cavity is 320 nm, a resonance peak that is amplified by about 2.5 times an intensity of light generated by a light source inside the micro-cavity may be obtained. Also, a full width at half-maximum of the resonance peak is about 10 nm which is very narrow. FIG. 13 illustrates a result when the reflective layer of FIG. 8C is used as the reflective layer 110. Referring to the graph of FIG. 13, when the optical length L of the micro-cavity is 380 nm, a resonance peak that is amplified by about 4.5 times an intensity of light generated by a light source inside the micro-cavity may be obtained, and a full width at half-maximum of the resonance peak is about 7 nm which is very narrow. Accordingly, because light having a wavelength other than a target wavelength is hardly emitted, very high color purity may be obtained.

Figure 14A:
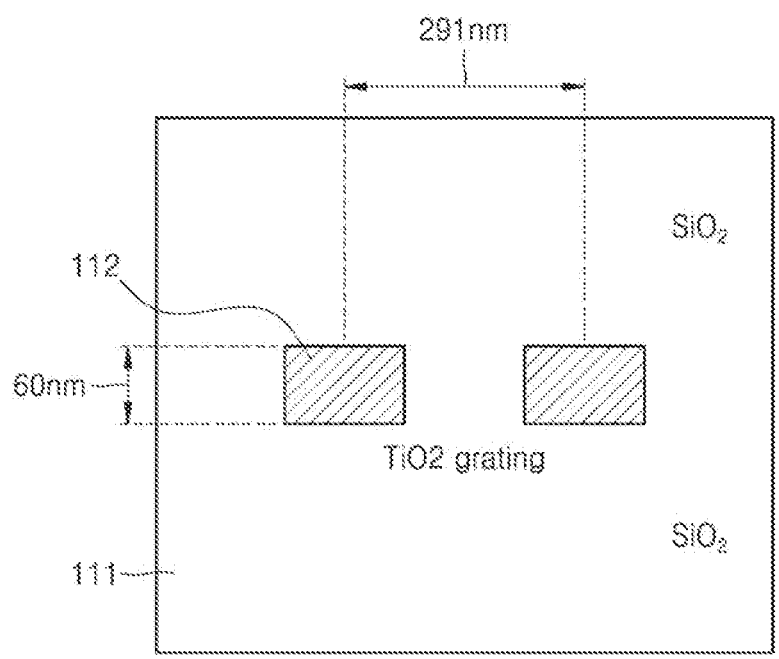
FIGS. 14A, 14B, and 14C are cross-sectional views illustrating a reflective layer having a selectively high reflectance respectively for blue light, green light, and red light according to another example embodiment.
Figure 14B:
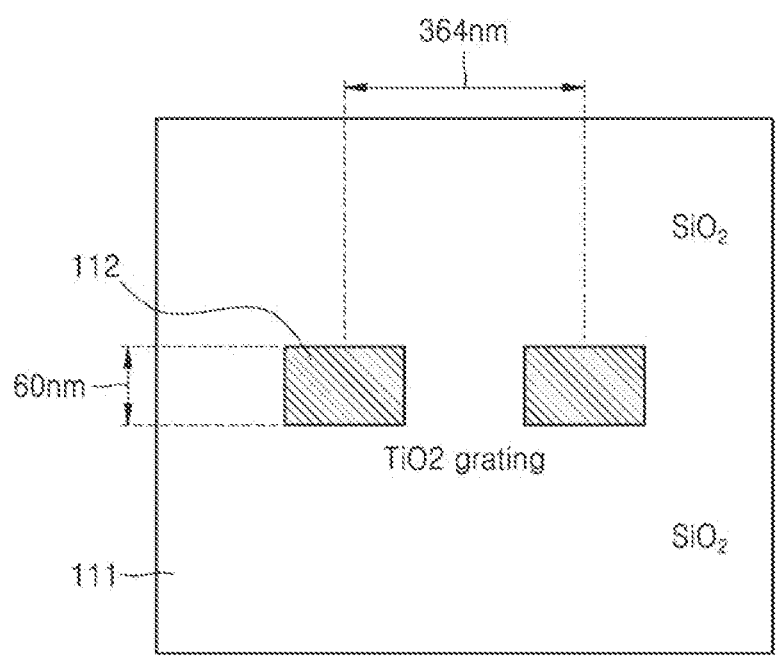
Figure 14C:
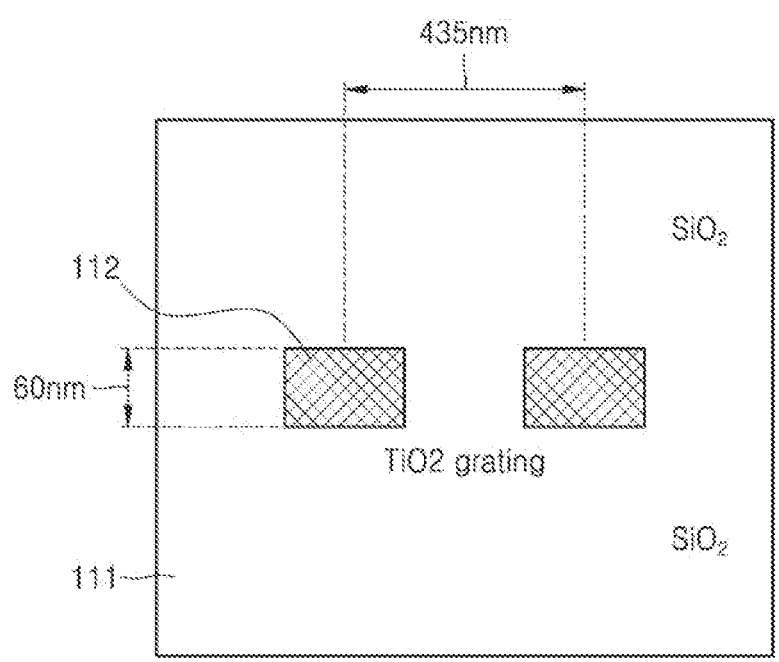

Although the nano-structure 112 is formed of Si in FIGS. 8A through 13, the nano-structure 112 may be formed of a material other than Si, and characteristics of the reflective layer 110 may be accordingly changed. FIGS. 14A through 14C are cross-sectional views illustrating the reflective layer 110 having a selectively high reflectance respectively for blue light, green light, and red light according to another example embodiment. Each nano-structure 112 has a cylindrical shape and is formed of $TiO_2$, and the low-refractive-index layer 111 is formed of $SiO_2$. In FIGS. 14A through 14C, a thickness of the nano-structure 112 is fixed to 60 nm. A period of the plurality of nano-structures 112 is selected to be smaller than an emission wavelength. For example, a period of the plurality of nano-structures 112 of the reflective layer 110 of FIG. 14A which reflects blue light may be 291 nm, a period of the plurality of nano-structures 112 of the reflective layer 110 of FIG. 14B which reflects green light may be 364 nm, and a period of the plurality of nano-structures 112 of the reflective layer 110 of FIG. 14C which reflects red light may be 435 nm. In FIGS. 14A through 14C, a diameter of each nano-structure 112 is selected to be ½ of the period.

Figure 15:
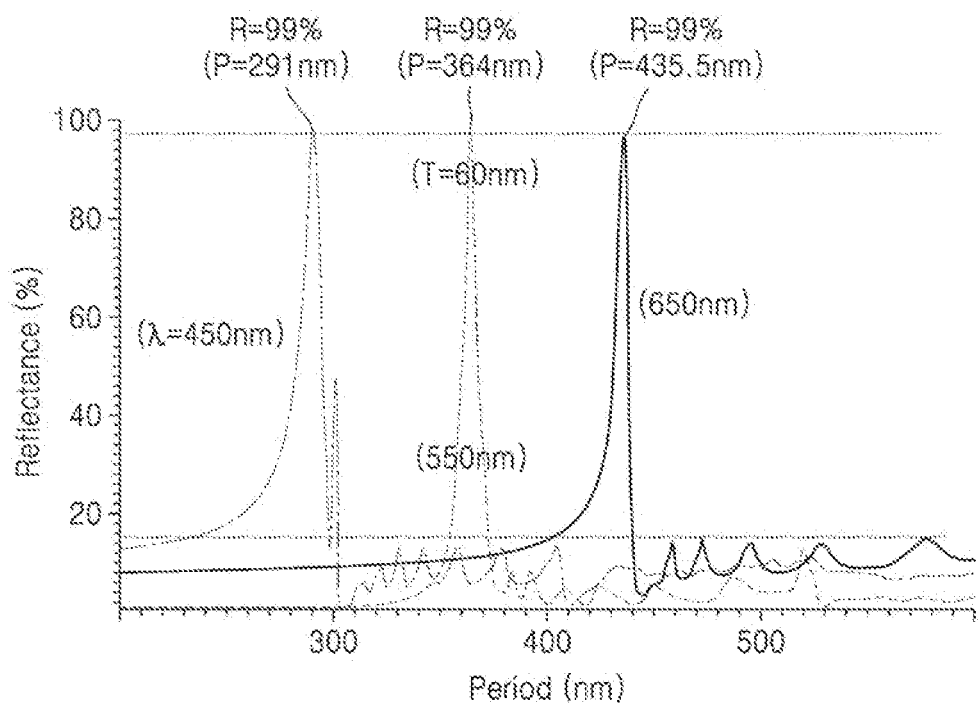
FIG. 15 is a graph illustrating a relationship between a period of a plurality of nano-structures and a reflectance of a reflective layer for blue light, green light, and red light.

FIG. 15 is a graph illustrating a relationship between a period of the plurality of nano-structures 112 and a reflectance of the reflective layer 110 for blue light, green light, and red light. For blue light, a reflectance of about 99% may be obtained when a period of the plurality of nano-structures 112 is 291 nm, and a reflectance is rapidly reduced when the period of the plurality of nano-structures 112 is changed. For green light, a reflectance of about 99% may be obtained when a period of the plurality of nano-structures 112 is 364 nm, and a reflectance is rapidly reduced when the period of the plurality of nano-structures 112 is changed. For red light, a reflectance of about 99% may be obtained when a period of the plurality of nano-structures 112 is 435 nm, and a reflectance is rapidly reduced as the period of the plurality of nano-structures 112 is changed.

Figure 16:
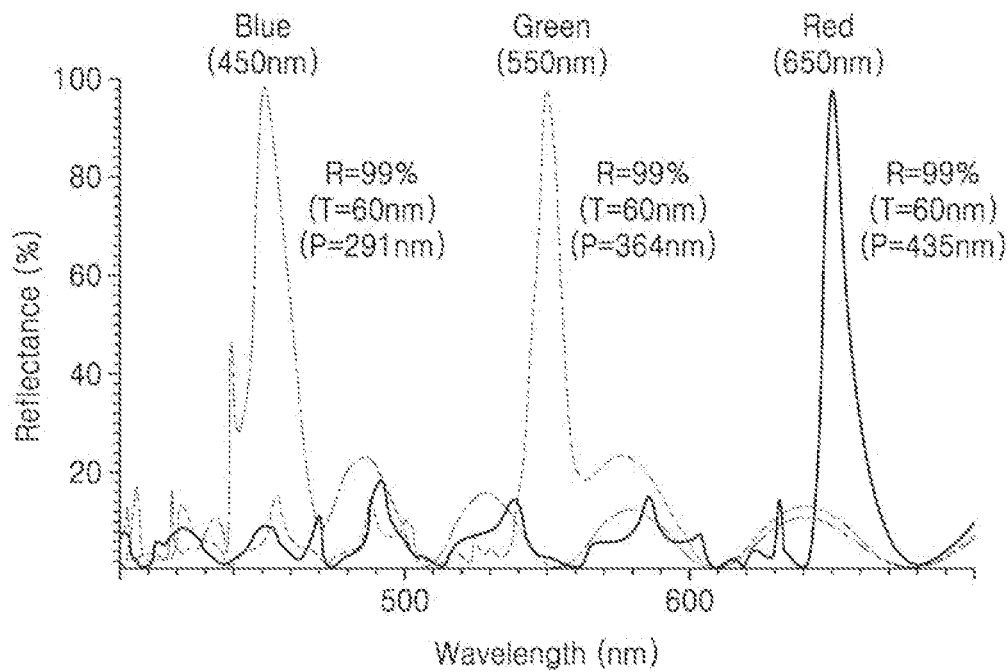
FIG. 16 is a graph illustrating a relationship between a reflectance of a reflective layer and a wavelength for a period of a plurality of nano-structures.

FIG. 16 is a graph illustrating a relationship between a reflectance of the reflective layer 110 and a wavelength for a period of the plurality of nano-structures 112. Referring to the graph of FIG. 16, the reflective layer 110 of FIG. 14A has a highest reflectance of 99% for blue light having a wavelength of about 450 nm, the reflective layer 110 of FIG. 14B has a highest reflectance of 99% for green light having a wavelength of about 550 nm, and the reflective layer 110 of FIG. 14C has a highest reflectance of 99% for red light having a wavelength of about 650 nm. FIG. 16 also illustrates that crosstalk noise of a wavelength other than a target wavelength is less than about 20%, and thus a wavelength selectivity of the reflective layer 110 is relatively good.

Figure 17:
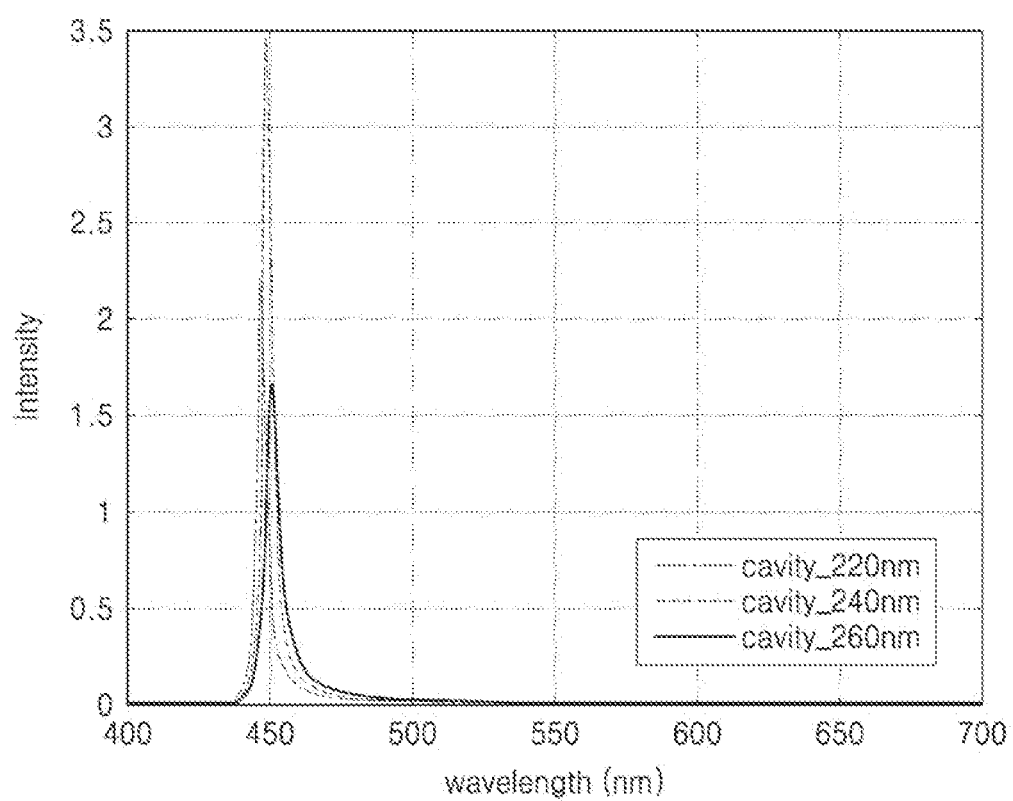
FIGS. 17, 18, and 19 are graphs illustrating emission spectra of blue light, green light, and red light according to an optical length of a micro-cavity.
Figure 18:
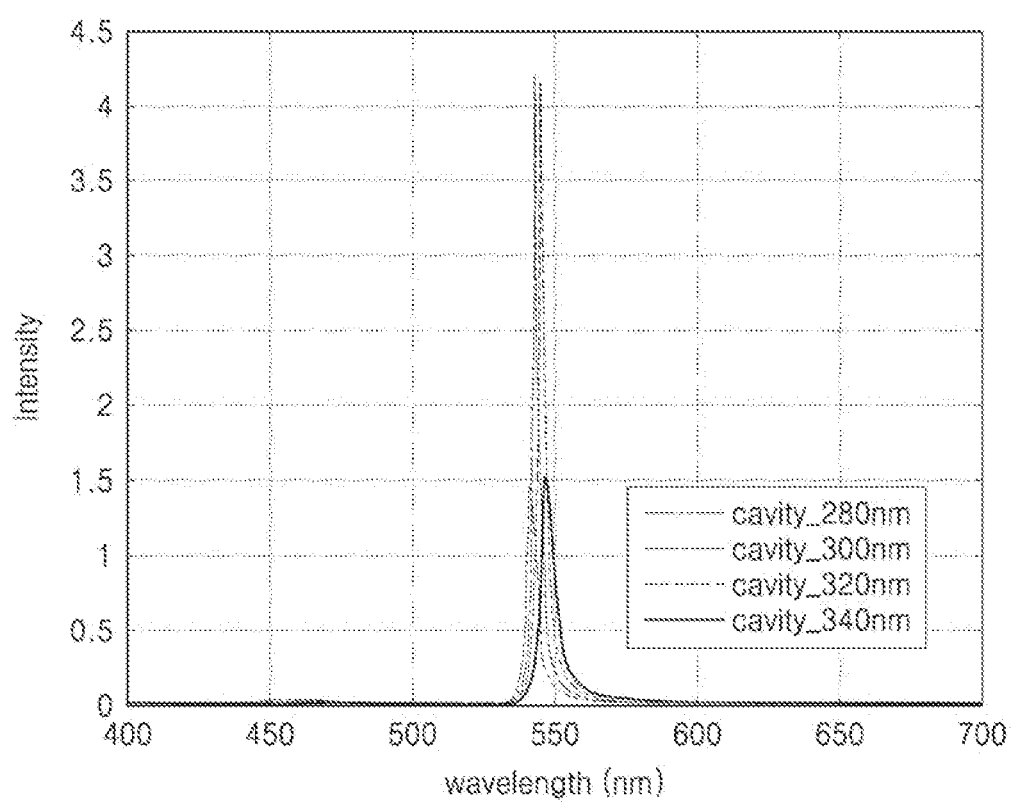
Figure 19:
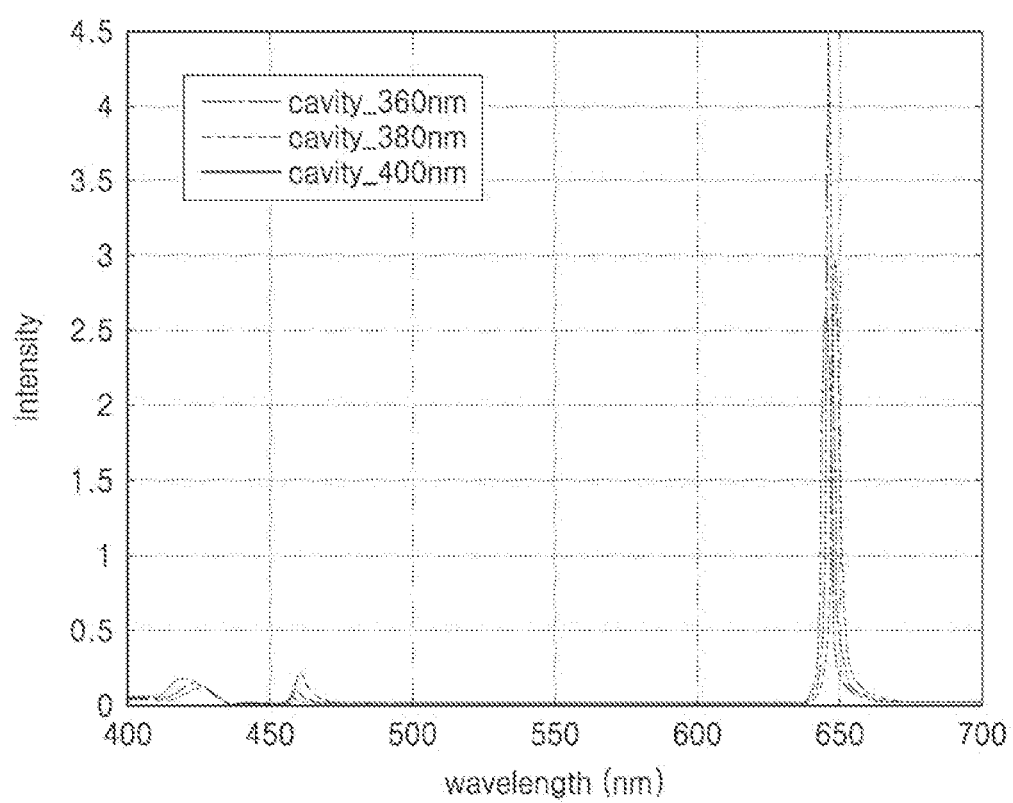

Also, FIGS. 17 through 19 are graphs illustrating emission spectra of blue light, green light, and red light according to an optical length of a micro-cavity. FIGS. 17 through 19 are obtained by applying the reflective layers 110 of FIGS. 14A through 14C to the structure of FIG. 10. In FIGS. 17 through 19, a white light source is disposed in $SiO_2$ between the reflective layer 110 and the second electrode 122, and an intensity of light emitted by the second electrode 122 is calculated.

FIG. 17 illustrates a result when the reflective layer of FIG. 14A is used as the reflective layer 110. Referring to the graph of FIG. 17, when the optical length L of the micro-cavity is 240 nm, a resonance peak that is amplified by about 3.5 times an intensity of light generated by a light source inside the micro-cavity may be obtained. FIG. 18 illustrates a result when the reflective layer of FIG. 14B is used as the reflective layer 110. Referring to the graph of FIG. 18, when the optical length L of the micro-cavity ranges from about 300 nm to about 320 nm, a resonance peak that is amplified by about 4.2 times an intensity of light generated by a light source inside the micro-cavity may be obtained. FIG. 19 illustrates a result when the reflective layer of FIG. 14C is used as the reflective layer 110. Referring to the graph of FIG. 19, when the optical length L of the micro-cavity is 380 nm, a resonance peak that is amplified by about 4.5 times an intensity of light generated by a light source inside the micro-cavity may be obtained. Also, a full width at half-maximum of each of the resonance peaks in the graphs of FIGS. 17 through 19 is about 3 nm which is very narrow, thereby significantly reducing crosstalk noise. Accordingly, because light having a wavelength other than a target wavelength is hardly emitted, very high color purity may be obtained.

Figure 20:
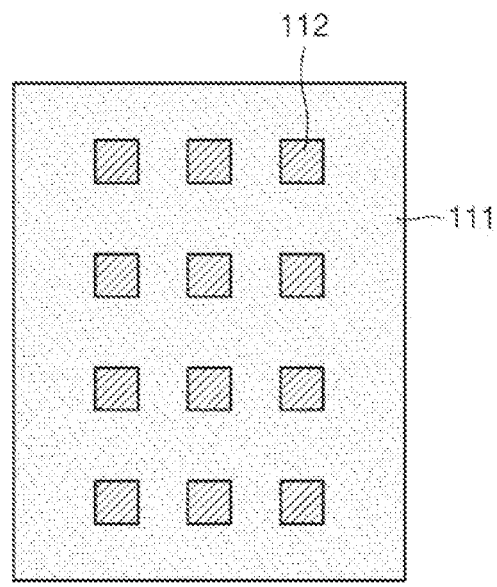
FIGS. 20 and 21 are plan views illustrating shapes of a plurality of nano-structures of a reflective layer according to other example embodiments.
Figure 21:
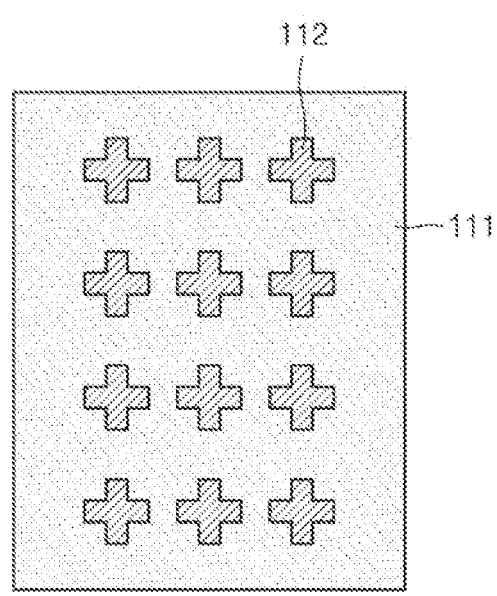

Although each nano-structure 112 has a cylindrical shape in FIGS. 8A through 19, the nano-structure 112 may have any of various other shapes. For example, FIGS. 20 and 21 are plan views illustrating shapes of a plurality of nano-structures of a reflective layer according to other example embodiments. As shown in FIG. 20, each nano-structure 112 may have a rectangular column shape, or as shown in FIG. 21, each nano-structure 112 may have a cross-like column shape. However embodiments are not limited thereto. For example, each nano-structure 112 may have an elliptical column shape, or a polygonal column shape such as a pentagonal column shape or the like. Reflection characteristics of the reflective layer 110 may vary according to a shape of the nano-structure 112.

Figure 22:
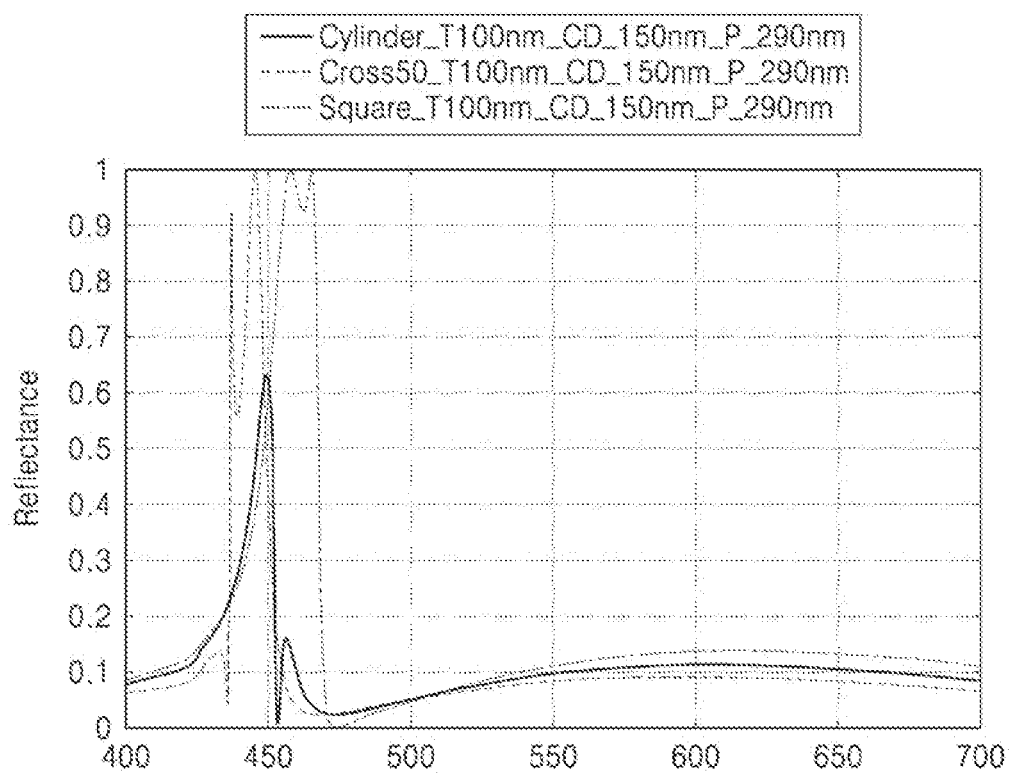
FIG. 22 is a graph illustrating reflection characteristics of a reflective layer, which is configured to reflect blue light, according to a shape of a nano-structure.
Figure 23:
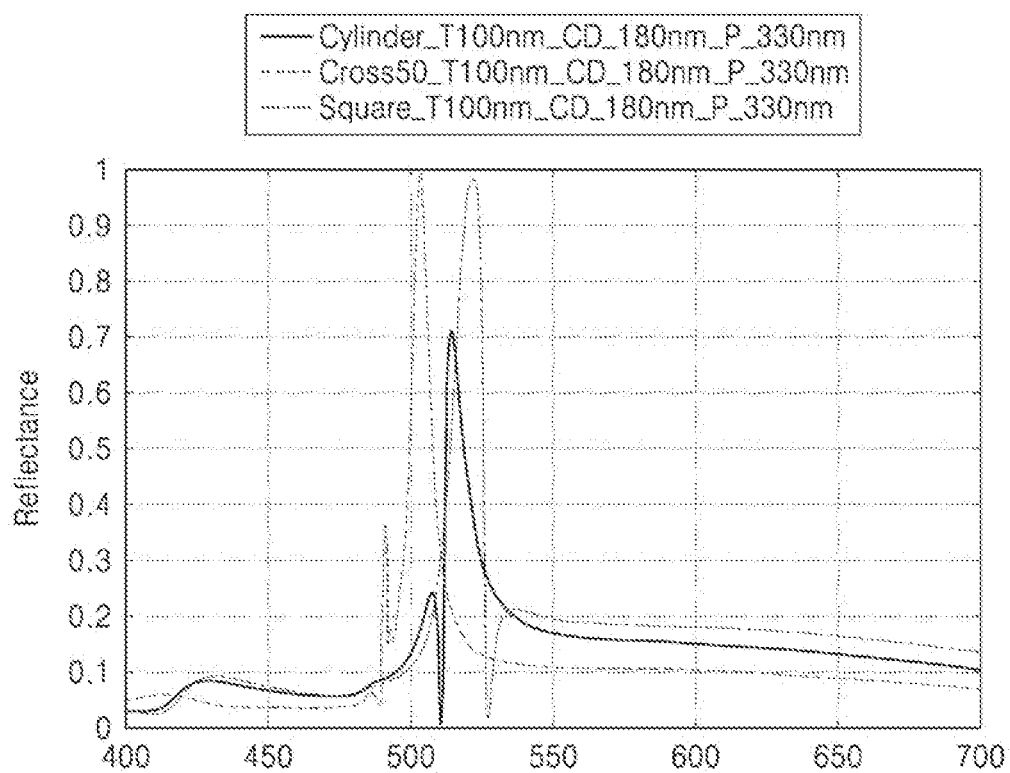
FIG. 23 is a graph illustrating reflection characteristics of a reflective layer, which is configured to reflect green light, according to a shape of a nano-structure.
Figure 24:
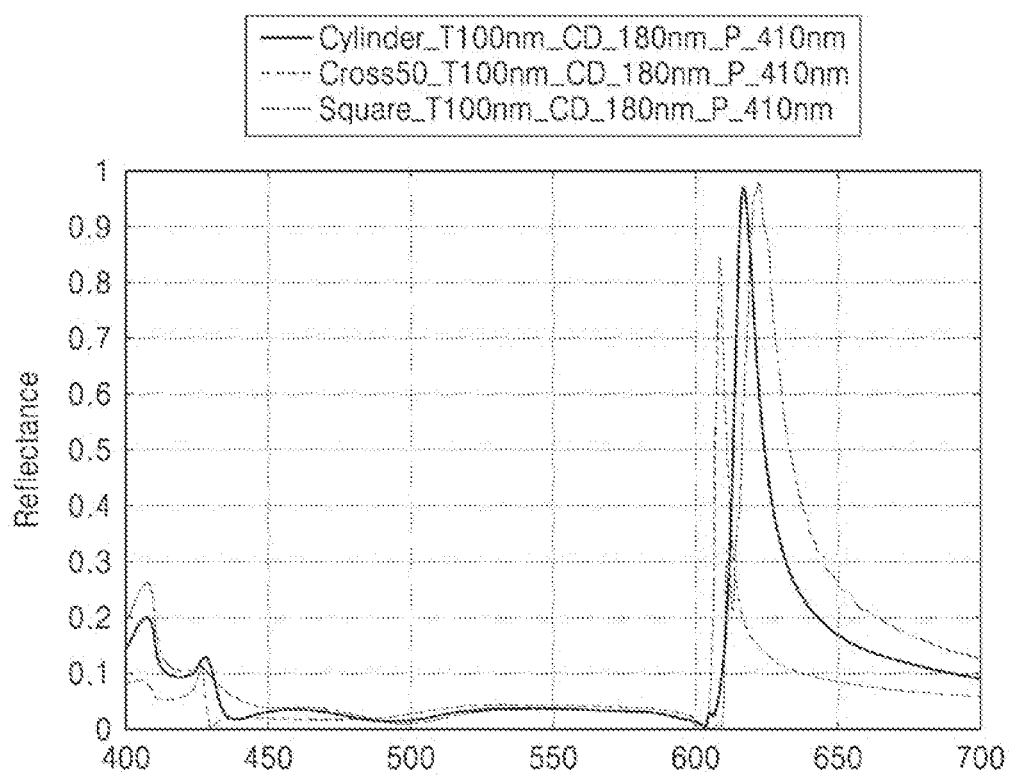
FIG. 24 is a graph illustrating reflection characteristics of a reflective layer, which is configured to reflect red light, according to a shape of a nano-structure.

For example, FIG. 22 is a graph illustrating reflection characteristics of the reflective layer 110, which is configured to reflect blue light, according to a shape of the nano-structure 112. FIG. 23 is a graph illustrating reflection characteristics of the reflective layer 110, which is configured to reflect green light, according to a shape of the nano-structure 112. FIG. 24 is a graph illustrating reflection characteristics of the reflective layer 110, which is configured to reflect red light, according to a shape of the nano-structure 112.

Each nano-structure 112 is formed of Si, and the low-refractive-index layer 111 is formed of $SiO_2$. A solid line in each of FIGS. 22 through 24 indicates a case where the nano-structure 112 has a cylindrical shape, a dashed line indicates a case where the nano-structure 112 has a cross-like column shape, and a dash-dotted line indicates a case where the nano-structure 112 has a square column shape. In all of the examples, a thickness of the nano-structure 112 is fixed to 100 nm. In the reflective layer 110 for reflecting blue light, a width of the nano-structure 112 is 150 nm and a period of the plurality of nano-structures 112 is 290 nm. In the reflective layer 110 for reflecting green light, a width of the nano-structure 112 is 180 nm and a period of the plurality of nano-structures 112 is 330 nm. In the reflective layer 110 for reflecting red light, a width of the nano-structure 112 is 180 nm and a period of the plurality of nano-structures 112 is 410 nm.

Referring to FIGS. 22 through 24, when the nano-structure 112 has a cylindrical shape, a reflectance peak was formed at 450 nm, 550 nm, and 650 nm. When the nano-structure 112 has a cross-like column shape, a reflectance peak was formed at wavelengths slightly shorter than 450 nm, 550 nm, and 650 nm. When the nano-structure 112 has a square column shape, a reflectance peak was formed at wavelengths slightly longer than 450 nm, 550 nm, and 650 nm. In the reflective layers 110 for reflecting blue light and green light, a reflectance of each of the nano-structures 112 having a cross-like column shape and a square column shape was higher than a reflectance of the nano-structure 112 having a cylindrical shape. In the reflective layer 110 for reflecting red light, a reflectance of the nano-structure having a square column shape was similar to a reflectance of the nano-structure 112 having a cylindrical shape. Accordingly, even when the nano-structure 112 has a shape other than a cylindrical shape, the reflective layer 110 having a selectively high reflectance may be designed, and a desired wavelength of reflected light may be controlled by changing dimensions of the nano-structure 112.

Figure 25:
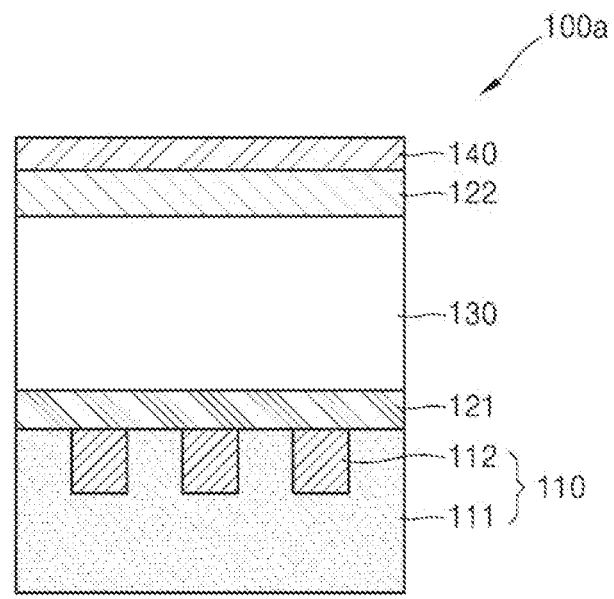
FIG. 25 is a cross-sectional view illustrating a structure of a light-emitting device according to another example embodiment.

FIG. 25 is a cross-sectional view illustrating a structure of a light-emitting device according to another example embodiment. In the light-emitting device 100 of FIG. 1, the low-refractive-index layer 111 completely covers a top surface of the nano-structure 112. However, in a light-emitting device 100a of FIG. 25, the low-refractive-index layer 111 does not cover top surfaces of the nano-structures 112, and the top surfaces of the plurality of nano-structures 112 and a top surface of the low-refractive-index layer 111 are disposed on the same plane. The top surfaces of the plurality of nano-structures 112 and the top surface of the low-refractive-index layer 111 may directly contact the first electrode 121. Side surfaces and bottom surfaces of the plurality of nano-structures 112 may be completely surrounded and encapsulated by the low-refractive-index layer 111.

Figure 26:
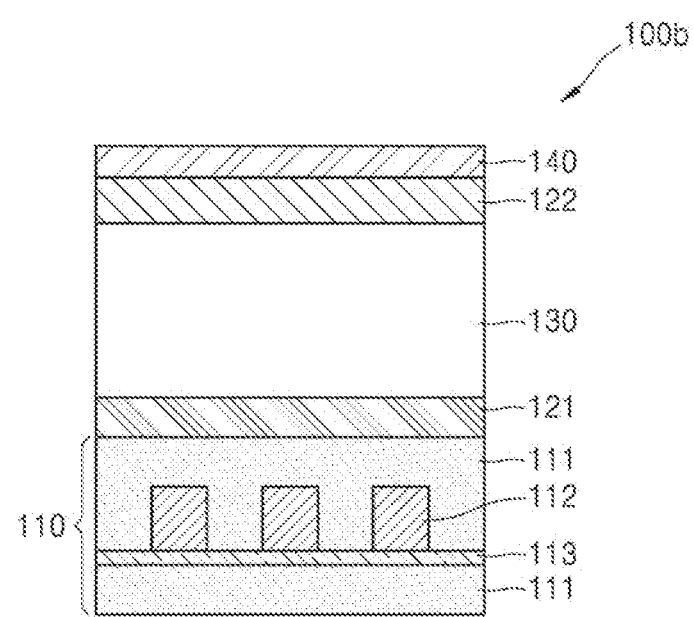
FIG. 26 is a cross-sectional view illustrating a structure of a light-emitting device according to another example embodiment.

FIG. 26 is a cross-sectional view illustrating a structure of a light-emitting device according to another example embodiment. Referring to FIG. 26, the reflective layer 110 of a light-emitting device 100b may further include a metal reflective film 113 that is flat and has a high reflectance. For example, the metal reflective film 113 may include silver (Ag), aluminum (Al), gold (Au), nickel (Ni), or a combination thereof. The metal reflective film 113 may directly contact a bottom surface of the nano-structure 112. The low-refractive-index layer 111 may surround a bottom surface of the metal reflective film 113 and a top surface of the metal reflective film 113 which does not contact the nano-structure 112.

Figure 27:
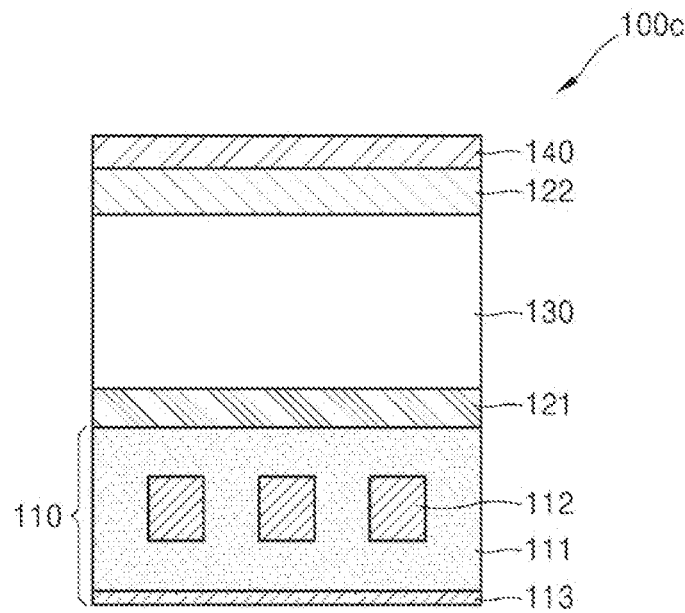
FIG. 27 is a cross-sectional view illustrating a structure of a light-emitting device according to another example embodiment.

FIG. 27 is a cross-sectional view illustrating a structure of a light-emitting device according to another example embodiment. Although the metal reflective film 113 directly contacts the bottom surface of the nano-structure 112 in FIG. 26, embodiments are not limited thereto. In a light-emitting device 100c of FIG. 27, the metal reflective film 113 may be disposed on a bottom surface of the low-refractive-index layer 111. In this case, the metal reflective film 113 does not directly contact the nano-structure 112.

Figure 28:
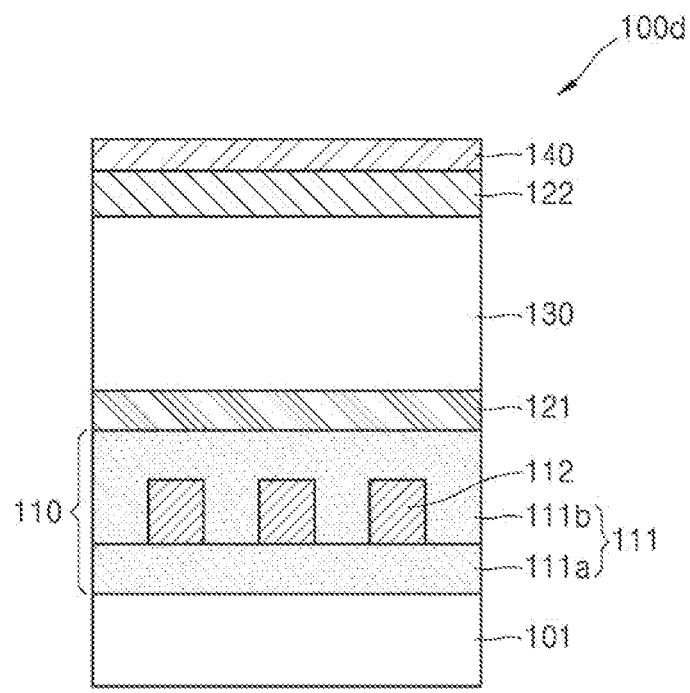
FIG. 28 is a cross-sectional view illustrating a structure of a light-emitting device according to another example embodiment.

FIG. 28 is a cross-sectional view illustrating a structure of a light-emitting device according to another example embodiment. Referring to FIG. 28, a light-emitting device 100d may further include a substrate 101. Examples of the substrate 101 may include a semiconductor substrate such as a silicon (Si) substrate, a transparent glass substrate, and a transparent polymer substrate. The reflective layer 110, the first electrode 121, the organic emission layer 130, the second electrode 122, and the passivation layer 140 may be sequentially stacked on the substrate 101.

Also, the low-refractive-index layer 111 may be formed of two different dielectric materials. For example, the low-refractive-index layer 111 may include a first low-refractive-index layer 111a disposed under the nano-structure 112 and a second low-refractive-index layer 111b disposed to cover side surfaces and a top surface of the nano-structure 112. The first low-refractive-index layer 111a and the second low-refractive-index layer 111b may have different refractive indexes, and may each be formed of a transparent dielectric material having a refractive index lower than a refractive index of the nano-structure 112. A wavelength of reflected light reflected by the reflective layer 110 may be controlled by the first low-refractive-index layer 111a and the second low-refractive-index layer 111b.

As described above, blue light, green light, and red light may be emitted with high efficiency and a narrow full width at half-maximum according to the optical length L of the micro-cavity, by using the reflective layer 110 including the plurality of nano-structures 112 formed of a non-metallic material. An emission wavelength of the light-emitting device 100 may be more easily determined only by changing widths and/or periods of the nano-structures 112 while fixing heights of the nano-structures 112 of the reflective layer 110 and the optical length L of the micro-cavity. Accordingly, when the light-emitting device 100 according to an example embodiment is applied to red, green, blue (RGB) sub-pixels of a display apparatus, a process of manufacturing the display apparatus may be facilitated.

Figure 29:
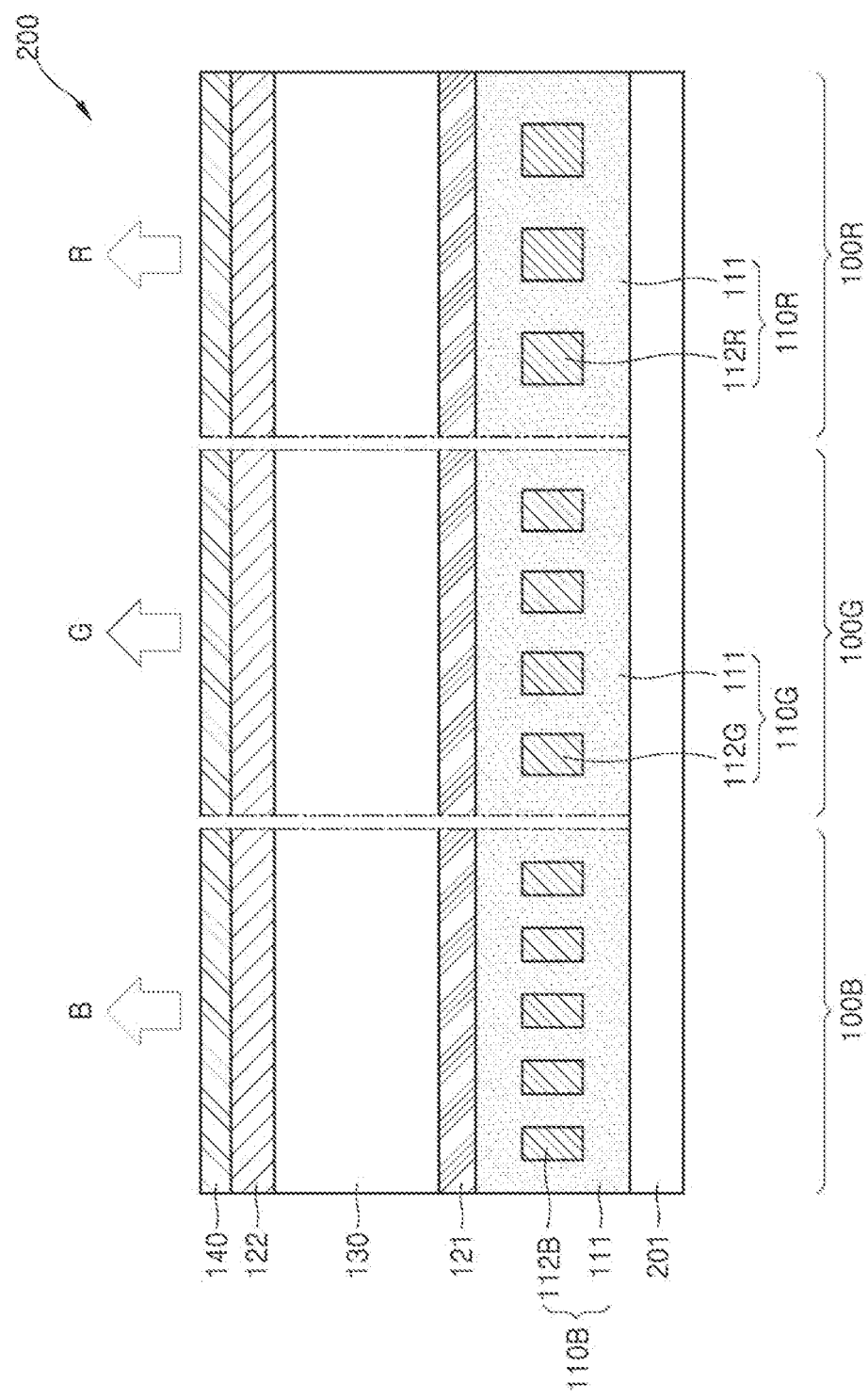
FIG. 29 is a cross-sectional view illustrating a structure of a display apparatus according to an example embodiment.

For example, FIG. 29 is a cross-sectional view illustrating a structure of a display apparatus according to an example embodiment. Referring to FIG. 29, a display apparatus 200 according to an example embodiment may include a display substrate 201 and a first pixel 100B, a second pixel 100G, and a third pixel 100R aligned on the display substrate 201. In FIG. 29, although each of the first through third pixels 100B, 100G, and 100R has the same structure as that of the light-emitting device 100 of FIG. 1, each of the first through third pixels 100B, 100G, and 100R may have a structure of any of the light-emitting devices 100a, 100b, 100c, and 100d of FIGS. 25 through 28. Also, although only one first pixel 100B, one second pixel 100G, and one third pixel 100R are illustrated for convenience of explanation in FIG. 29, a large number of first through third pixels 100B, 100G, and 100R may be repeatedly arranged.

The first through third pixels 100B, 100G, and 100R may include reflective layers 110B, 110G, and 110R respectively including a plurality of nano-structures 112B, 112G, and 112R that are two-dimensionally arranged, the first electrode 121 disposed on the reflective layers 110B, 110G, and 110R, the organic emission layer 130 disposed on the first electrode 121, and the second electrode 122 disposed on the organic emission layer 130. Also, the first through third pixels 100B, 100G, and 100R may each further include the passivation layer 140 that is transparent and is disposed on the second electrode 122 to protect the second electrode 122.

The first through third pixels 100B, 100G, and 100R may be configured to emit light having different wavelengths. For example, the first pixel 100B may be configured to emit light B of a blue wavelength band, the second pixel 100G may be configured to emit light G of a green wavelength band, and the third pixel 100R may be configured to emit light R of a red wavelength band. To this end, the reflective layers 110B, 110G, and 110R of the first through third pixels 100B, 100G, and 100R may respectively include the nano-structures 112B, 112G, and 112R having different dimensions.

For example, a diameter of each nano-structure 112B, a height of each nano-structure 112B, and a period of the plurality of nano-structures 112B may be determined such that the reflective layer 110B of the first pixel 100B has a highest reflectance for the light B of the blue wavelength band and transmits or absorbs the light R and G of the remaining wavelength bands. Also, a diameter of each nano-structure 112G, a height of each nano-structure 112G, and a period of the plurality of nano-structures 112G may be determined so that the reflective layer 110G of the second pixel 100G has a highest reflectance for the light G of the green wavelength band and transmits or absorbs the light B and R of the remaining wavelength bands. Likewise, a diameter of each nano-structure 112R, a height of each nano-structure 112R, and a period of the plurality of nano-structures 112R may be determined so that the reflective layer 110R of the third pixel 100R has a highest reflectance for the light R of the red wavelength band and transmits or absorbs the light B and G of the remaining wavelength bands.

In particular, the first through third pixels 100B, 100G, and 100R may be configured such that heights of the plurality of nano-structures 112B, 112G, and 112R are fixed to be the same and diameters and periods of the plurality of nano-structures 112B, 112G, and 112R are different from one another. For example, a period of the nano-structure 112B of the first pixel 100B may be smaller than a blue wavelength, and may be smaller than a period of the nano-structure 112G of the second pixel 100G. A period of the nano-structure 112G of the second pixel 100G may be smaller than a green wavelength, and may be smaller than a period of the nano-structure 112R of the third pixel 100R. Also, a period of the nano-structure 112R of the third pixel 100R may be smaller than a red wavelength.

Optical lengths of micro-cavities in the first through third pixels 100B, 110G, and 100R may be the same. As described with reference to FIGS. 10 and 11, the optical lengths of the micro-cavities of the first through third pixels 100B, 100G, and 100R may correspond to a common multiple of an optical length for resonating blue light, an optical length for resonating green light, and an optical for resonating red light. Accordingly, emission wavelengths of the first through third pixels 100B, 100G, and 100R may be determined only with dimensions of the nano-structures 112B, 112G, and 112R of the reflective layers 110B, 110G, and 110R. In the first through third pixels 100B, 100G, and 100R, elements other than the reflective layers 110B, 110G, and 110R, for example, the first electrodes 121, the organic emission layers 130, and the second electrodes 122 may have the same composition and the same thickness. As a result, physical thicknesses of the first through third pixels 100B, 100G, and 100R may be the same. Accordingly, a process of manufacturing the display apparatus 200 may be more simplified and manufacturing costs may be reduced.

Figure 30:
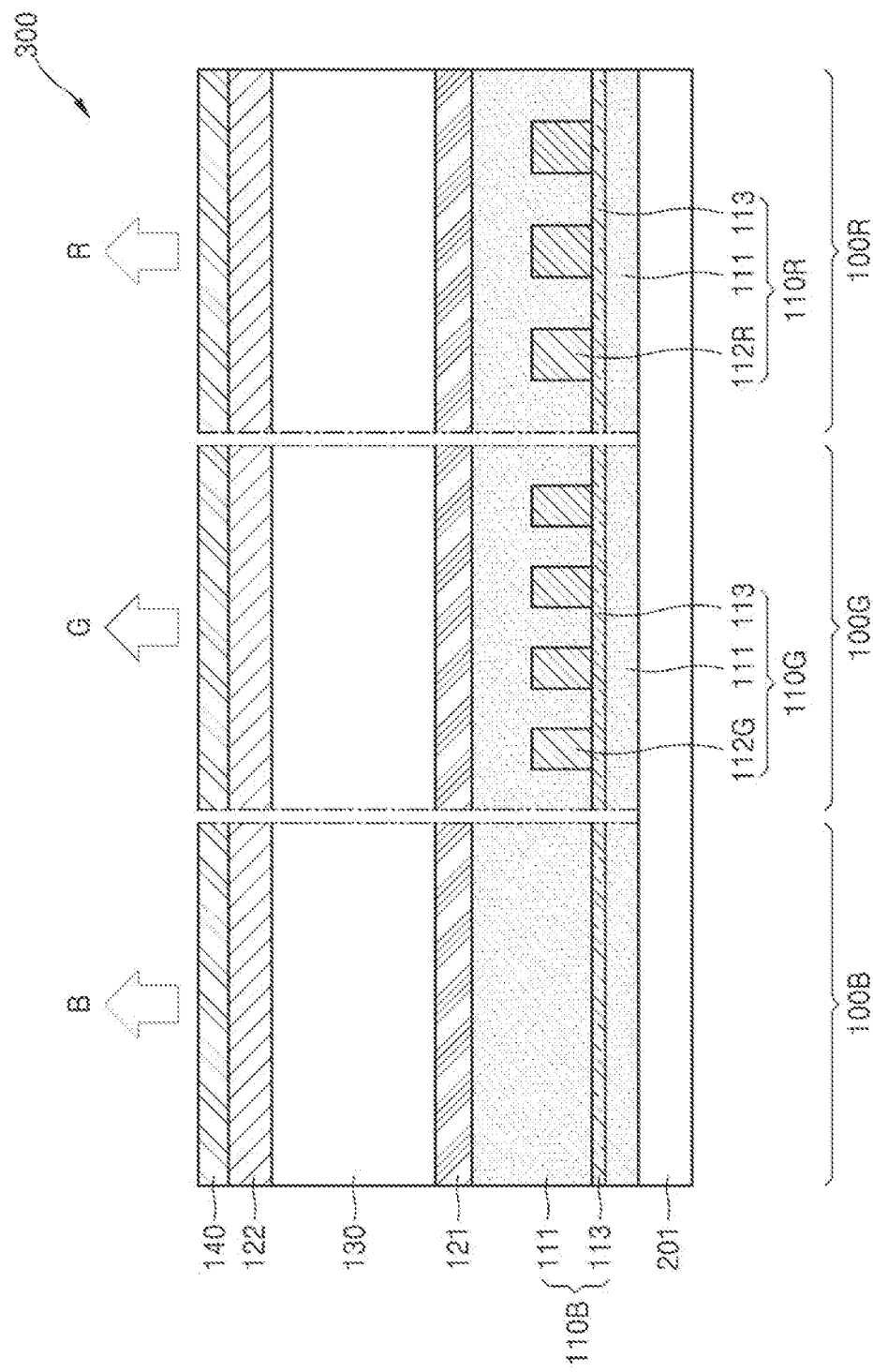
FIG. 30 is a cross-sectional view illustrating a structure of a display apparatus according to another example embodiment.

FIG. 30 is a cross-sectional view illustrating a structure of a display apparatus according to another example embodiment. In a display apparatus 300 of FIG. 30, the reflective layers 110G and 110R of the second pixel 100G and the third pixel 100R may respectively include the nano-structures 112G and 112R, but the reflective layer 110B of the first pixel 100B may not include nano-structures. Each of the reflective layers 110B, 110G, and 110R of the display apparatus 300 of FIG. 30 may further include the metal reflective film 113. The metal reflective film 113 may directly contact a bottom surface of each of the nano-structures 112G and 112R. However, as shown in FIG. 27, the metal reflective film 113 may contact a bottom surface of the low-refractive-index layer 111. The metal reflective films 113 of the reflective layers 110B, 110G, and 110R may be disposed on the same plane.

An optical length of a micro-cavity of the first pixel 100B may be determined such that a resonance wavelength matches a blue wavelength. For example, the optical length of the micro-cavity of the first pixel 100B may be determined by a sum of optical lengths of materials disposed between the metal reflective film 113 and the second electrode 122. Accordingly, the first pixel 100B may emit light B of blue wavelength band.

In the second pixel 100G and the third pixel 100R, resonance wavelengths of micro-cavities may be adjusted through a phase retardation of reflected light by using the nano-structures 112G and 112R. For example, the nano-structure 112G of the second pixel 100G may be configured such that the resonance wavelength of the micro-cavity of the second pixel 100G matches a green wavelength to delay a phase of reflected light and has a highest reflectance for light G of a green wavelength band. The nano-structure 112R of the third pixel 100R may be configured such that the resonance wavelength of the micro-cavity of the third pixel 100R matches a red wavelength to delay a phase of reflected light and has a highest reflectance for light R of a red wavelength band.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by one of ordinary skill in the art that various changes in form and details may be made therein without departing from the spirit and scope as defined by the following claims.

What is claimed is:
1. A display apparatus comprising:
   a first pixel configured to emit light of a first wavelength; and
   a second pixel configured to emit light of a second wavelength different from the first wavelength,
   wherein the first pixel comprises:
      a reflective layer comprising a plurality of nano-structures two-dimensionally disposed regularly and a low-refractive-index layer disposed adjacent to the plurality of nano-structures;
      a first electrode disposed on the reflective layer;
      an organic emission layer disposed on the first electrode and configured to emit visible light comprising light of the first wavelength and light of the second wavelength; and
      a second electrode disposed on the organic emission layer,
      wherein each of the plurality of nano-structures comprises a non-metallic material, and the low-refractive-index layer comprises a dielectric material having a second refractive index lower than a first refractive index of the non-metallic material, and
      wherein top surfaces of the plurality of nano-structures and a top surface of the low-refractive-index layer are coplanar.

2. The display apparatus of claim 1, wherein the first electrode is a transparent electrode, and the second electrode is a semi-transmissive electrode that is configured to reflect part of light and transmits remaining part of the light.

3. The display apparatus of claim 1, wherein the non-metallic material comprises a dielectric material or a semiconductor material.

4. The display apparatus of claim 3, wherein the dielectric material comprises at least one of $TiO_2$, $BaTiO_3$, $Cr_2O_3$, $HfO_2$, and SiNx.

5. The display apparatus of claim 3, wherein the semiconductor material comprises at least one of Si, ZnS, ZnSe, GaP, InP, GaAs, GaN, and $AlAs_2$.

6. The display apparatus of claim 1, wherein based on a diameter of each of the plurality of nano-structures, a height of each of the plurality of nano-structures, and a period of the plurality of nano-structures of the reflective layer, the reflective layer of the first pixel has a highest reflectance for light of the first wavelength and is configured to transmit or absorb light of the second wavelength.

7. The display apparatus of claim 6, wherein the period of the plurality of nano-structures is smaller than the first wavelength.

8. The display apparatus of claim 1,
wherein the top surfaces of the plurality of nano-structures and the top surface of the low-refractive-index layer directly contact the first electrode.

9. The display apparatus of claim 1, wherein the reflective layer further comprises a metal reflective film that is flat and disposed on a bottom surface of the low-refractive-index layer.

10. The display apparatus of claim 1, wherein the second pixel comprises:
a reflective layer comprising a plurality of nano-structures two-dimensionally disposed regularly and a low-refractive-index layer is disposed adjacent to the plurality of nano-structures;
a first electrode disposed on the reflective layer;
an organic emission layer disposed on the first electrode and configured to emit visible light comprising light of the first wavelength and light of the second wavelength; and
a second electrode disposed on the organic emission layer,
wherein each of the plurality of nano-structures of the reflective layer of the second pixel comprises a non-metallic material, and the low-refractive-index layer of the reflective layer of the second pixel comprises a dielectric material having a first refractive index lower than a second refractive index of the non-metallic material.

11. The display apparatus of claim 10, wherein based on a diameter of each of the plurality of nano-structures, a height of each of the plurality of nano-structures, and a period of the plurality of nano-structures of the second pixel, the reflective layer of the second pixel has a highest reflectance for light of the second wavelength and is configured to transmit or absorb light of the first wavelength.

12. The display apparatus of claim 10, wherein a height of each of the plurality of nano-structures of the reflective layer of the first pixel and a height of each of the plurality of nano-structures of the reflective layer of the second pixel are the same, and a period of the plurality of nano-structures of the reflective layer of the first pixel and a period of the plurality of nano-structures of the reflective layer of the second pixel are different from each other.

13. The display apparatus of claim 10, wherein the first electrode, the organic emission layer, and the second electrode of the first pixel are respectively the same as the first electrode, the organic emission layer, and the second electrode of the second pixel.

14. A display apparatus comprising:
a first pixel configured to emit light of a first wavelength; and
a second pixel configured to emit light of a second wavelength different from the first wavelength,
wherein the first pixel comprises:
a reflective layer comprising a plurality of nano-structures two-dimensionally disposed regularly and a low-refractive-index layer disposed adjacent to the plurality of nano-structures;
a first electrode disposed on the reflective layer;
an organic emission layer disposed on the first electrode and configured to emit visible light comprising light of the first wavelength and light of the second wavelength; and
a second electrode disposed on the organic emission layer,
wherein each of the plurality of nano-structures comprises a non-metallic material, and the low-refractive-index layer comprises a dielectric material having a second refractive index lower than a first refractive index of the non-metallic material, and
wherein a top surface of the low-refractive-index layer is disposed on top surfaces of the plurality of nano-structures, the top surfaces of the plurality of nano-structures are spaced apart from the first electrode, and the top surface of the low-refractive-index layer directly contacts the first electrode.

15. A display apparatus comprising:
a first pixel configured to emit light of a first wavelength; and
a second pixel configured to emit light of a second wavelength different from the first wavelength,
wherein the first pixel comprises:
a reflective layer comprising a plurality of nano-structures two-dimensionally disposed regularly and a low-refractive-index layer disposed adjacent to the plurality of nano-structures;
a first electrode disposed on the reflective layer;
an organic emission layer disposed on the first electrode and configured to emit visible light comprising light of the first wavelength and light of the second wavelength; and
a second electrode disposed on the organic emission layer,
wherein each of the plurality of nano-structures comprises a non-metallic material, and the low-refractive-index layer comprises a dielectric material having a second refractive index lower than a first refractive index of the non-metallic material,
wherein the reflective layer further comprises a metal reflective film that is flat and directly contacts bottom surfaces of the plurality of nano-structures, and
wherein the metal reflective film is included in the low-refractive-index layer such that the low-refractive-index layer is provided on a top surface of the metal reflective film and a bottom surface of the metal reflective film.

16. The display apparatus of claim 15, wherein the low-refractive-index layer is disposed on a top surface of the metal reflective film that is not in contact with the bottom surfaces of the plurality of nano-structures and is disposed on the bottom surface of the metal reflective film.

* * * * *